United States Patent
Rasouli et al.

(10) Patent No.: US 11,545,965 B2
(45) Date of Patent: Jan. 3, 2023

(54) CLOCK GATING CIRCUIT AND METHOD OF OPERATING THE SAME

(71) Applicant: TAIWAN SEMICONDUCTOR MANUFACTURING COMPANY, LTD., Hsinchu (TW)

(72) Inventors: Seid Hadi Rasouli, Hsinchu (TW); Jerry Chang Jui Kao, Hsinchu (TW); Xiangdong Chen, Hsinchu (TW); Tzu-Ying Lin, Hsinchu (TW); Yung-Chen Chen, Hsinchu (TW); Hui-Zhong Zhuang, Hsinchu (TW); Chi-Lin Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 128 days.

(21) Appl. No.: 17/095,191

(22) Filed: Nov. 11, 2020

(65) Prior Publication Data
US 2021/0226615 A1     Jul. 22, 2021

Related U.S. Application Data

(60) Provisional application No. 62/962,817, filed on Jan. 17, 2020.

(51) Int. Cl.
*H03K 3/037*     (2006.01)
*G06F 1/12*      (2006.01)
*H03K 19/20*     (2006.01)

(52) U.S. Cl.
CPC .............. *H03K 3/037* (2013.01); *G06F 1/12* (2013.01); *H03K 19/20* (2013.01)

(58) Field of Classification Search
CPC .... H03K 19/0016; H03K 19/20; H03K 3/027; H03K 3/037; H03K 3/353; H03K 3/356; H03K 3/356156; G06F 1/10; G06F 1/12
See application file for complete search history.

(56) References Cited

U.S. PATENT DOCUMENTS 8,030,982 B2 * 10/2011 Datta ............... H03K 3/356086
                                                327/211
9,966,953 B2 * 5/2018 Ye ..................... H03K 19/0016
(Continued)

FOREIGN PATENT DOCUMENTS

| KR | 20150083769 | 7/2015 |
| KR | 20160127621 | 11/2016 |
| WO | 2010059359 | 5/2010 |

OTHER PUBLICATIONS

Office Action dated Aug. 18, 2021 for corresponding application No. TW 11020800100. (pp. 1-3).
(Continued)

*Primary Examiner* — Jason Crawford
(74) *Attorney, Agent, or Firm* — Hauptman Ham, LLP

(57) ABSTRACT

A clock gating circuit includes a NOR logic gate, a transmission gate, a cross-coupled pair of transistors, and a first transistor. The NOR logic gate is coupled to a first node, and receives a first and a second enable signal, and outputs a first control signal. The transmission gate is coupled between the first and a second node, and receives the first control signal, an inverted clock input signal and a clock output signal. The cross-coupled pair of transistors is coupled between the second node and an output node, and receives at least a second control signal. The first transistor includes a first gate terminal configured to receive the inverted clock input signal, a first drain terminal coupled to the output node, and a first source terminal coupled to a reference voltage supply. The first transistor adjusts the clock output signal responsive to the inverted clock input signal.

20 Claims, 15 Drawing Sheets

(56) References Cited

U.S. PATENT DOCUMENTS

| | | |
|---|---|---|
| 10,033,359 B2* | 7/2018 | Ye .................... H03K 3/0375 |
| 2010/0109747 A1* | 5/2010 | Datta ............. H03K 3/356086 |
| | | 327/379 |
| 2012/0236675 A1* | 9/2012 | Chan ...................... G11C 8/18 |
| | | 365/230.06 |
| 2014/0184271 A1* | 7/2014 | Gurumurthy ...... H03K 19/0016 |
| | | 326/93 |
| 2016/0077544 A1* | 3/2016 | Tzeng ..................... G06F 1/10 |
| | | 327/291 |
| 2018/0062658 A1 | 3/2018 | Hsu et al. |
| 2018/0167058 A1 | 6/2018 | Hadi et al. |
| 2019/0044511 A1* | 2/2019 | Hsu ........................ G06F 30/30 |
| 2019/0305761 A1* | 10/2019 | Huang ................ H03K 3/0375 |
| 2021/0064076 A1* | 3/2021 | Shamanna ......... H03K 19/0016 |
| 2021/0226615 A1* | 7/2021 | Rasouli .................... G06F 1/12 |
| 2022/0026945 A1* | 1/2022 | Shamanna ............... G06F 1/10 |

OTHER PUBLICATIONS

Notice of Allowance dated Aug. 18, 2022 from corresponding application No. KR 10-2021-0002697 (pp. 1-4).

* cited by examiner

CLOCK GATING CIRCUIT AND METHOD OF OPERATING THE SAME

PRIORITY CLAIM AND CROSS-REFERENCE

This application claims the benefit of U.S. Provisional Application No. 62/962,817, filed Jan. 17, 2020, which is herein incorporated by reference in its entirety.

BACKGROUND

The semiconductor integrated circuit (IC) industry has produced a wide variety of digital devices to address issues in a number of different areas. Some of these digital devices, such as a clock tree, is used for distributing a common clock signal to various circuits in order to synchronize the operation of the various circuits. In some instances, the differences in the arrival time of the clock signals at two or more of the various circuits within the IC results in errors that affect IC performance. Furthermore, as ICs have become smaller and more complex, the consumption of power by the clock tree also affects IC performance and area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
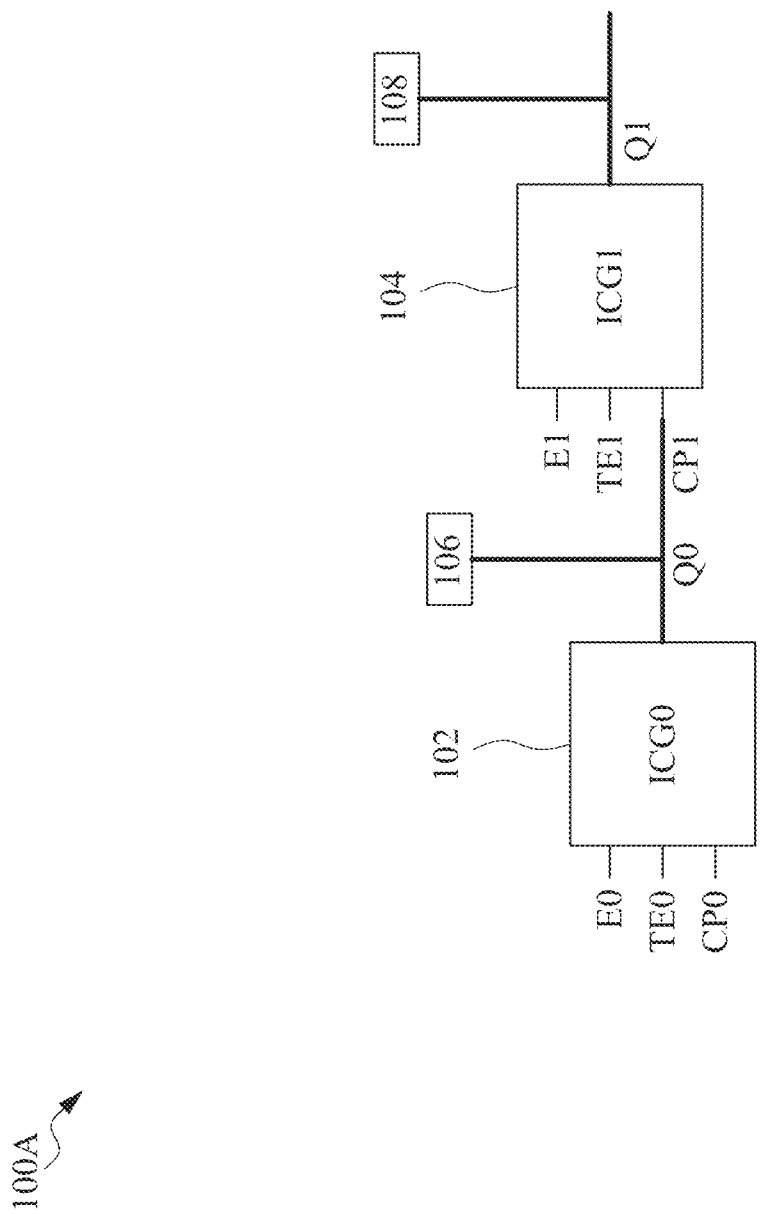
FIG. 1A is a block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a clock gating circuit includes a NOR logic gate, a transmission gate, a cross-coupled pair of transistors, and a first transistor. The NOR logic gate is coupled to a first node, and is configured to receive a first enable signal and a second enable signal, and to output a first control signal. The transmission gate is coupled between the first node and a second node, and is configured to receive the first control signal, an inverted clock input signal and a clock output signal.

The cross-coupled pair of transistors is coupled between the second node and an output node, and is configured to receive at least a second control signal. The first transistor is configured to adjust the clock output signal responsive to the inverted clock input signal. In some embodiments, the first transistor is of a first type. The first transistor includes a first gate terminal, a first drain terminal and a first source terminal. The first gate terminal is configured to receive the inverted clock input signal. The first drain terminal is coupled to at least the output node. The first source terminal is coupled to a reference voltage supply.

By utilizing the clock gating circuit, a number of transistors toggled by the inverted input clock signal is reduced when compared with other clock gating circuits, resulting in the clock gating circuit consuming less dynamic clock power than other clock gating cells. In some embodiments, by utilizing clock gating circuit, the total number of transistors is reduced when compared with other clock gating cells resulting in clock gating circuit occupying less area than other clock gating cells.

Integrated Circuit

FIG. 1A is a block diagram of an integrated circuit 100A, in accordance with some embodiments.

Integrated circuit 100A comprises a clock gating cell 102, a clock gating cell 104, a logic cell 106 and a logic cell 108.

Clock gating cell 102 is coupled to clock gating cell 104 and logic cell 106. Clock gating cell 104 is coupled to clock gating cell 102 and logic cell 108.

Clock gating cell 102 is configured to receive an input clock signal CP0, a test enable signal TE0 and an enable signal E0. Clock gating cell 102 is configured to output an output clock signal Q0 on an output terminal. In some embodiments, input clock signal CP0 is an oscillating signal having an oscillation frequency F0in. In some embodiments, input clock signal CP0 is a single phase clock. In some embodiments, output clock signal Q0 is an oscillating signal having an oscillation frequency F0out.

In some embodiments, if the clock gating cell 102 is enabled or activated by the enable signal E0 or the test enable signal TE0, then the output clock signal Q0 toggles or oscillates with oscillation frequency F0out, and the output clock signal Q0 is substantially equal to the input clock signal CP0. In some embodiments, substantially equal includes values within a range of a reference value, e.g., ±5% of the reference value.

In some embodiments, if the clock gating cell 102 is disabled or deactivated by the enable signal E0 or the test enable signal TE0, then the output clock signal Q0 is fixed with a logically low signal or a logically high signal.

An input terminal of clock gating cell 104 is coupled to the output terminal of clock gating cell 102, and is configured to receive the output clock signal Q0. In some embodiments, the output clock signal Q0 corresponds to an input clock signal CP1.

Clock gating cell 104 is configured to receive the input clock signal CP1, a test enable signal TE1 and an enable signal E1. Clock gating cell 104 is configured to output an output clock signal Q1 on an output terminal. In some embodiments, input clock signal CP1 is an oscillating signal having an oscillation frequency F1in. In some embodiments, input clock signal CP1 is a single phase clock. In some embodiments, output clock signal Q1 is an oscillating signal having an oscillation frequency F1out.

In some embodiments, if the clock gating cell 104 is enabled or activated by the enable signal E1 or the test enable signal TE1, then the output clock signal Q1 toggles or oscillates with oscillation frequency F1out, and the output clock signal Q1 is substantially equal to the input clock signal CP1.

In some embodiments, if the clock gating cell 104 is disabled or deactivated by the enable signal E1 or the test enable signal TE1, then the output clock signal Q1 is fixed with a logically low signal or a logically high signal.

In some embodiments, at least clock gating cell 102 or 104 is an integrated clock gating (ICG) cell. Other numbers of clock gating cells 102 or 104 or clock tree branches in FIG. 1A are within the scope of the present disclosure.

Logic cell 106 is coupled to the output terminal of clock gating cell 102, and is configured to receive the output clock signal Q0 from the clock gating cell 102. In some embodiments, logic cell 106 includes at least one or more flip-flops or one or more multi-bit flip-flops (MBFFs).

Logic cell 108 is coupled to the output terminal of clock gating cell 104, and is configured to receive the output clock signal Q1 from the clock gating cell 104. In some embodiments, logic cell 108 includes at least one or more flip-flops or one or more MBFFs.

Other numbers of logic cells 106 or 108 or other types of logic cells in FIG. 1A are within the scope of the present disclosure.

Figure 1B:
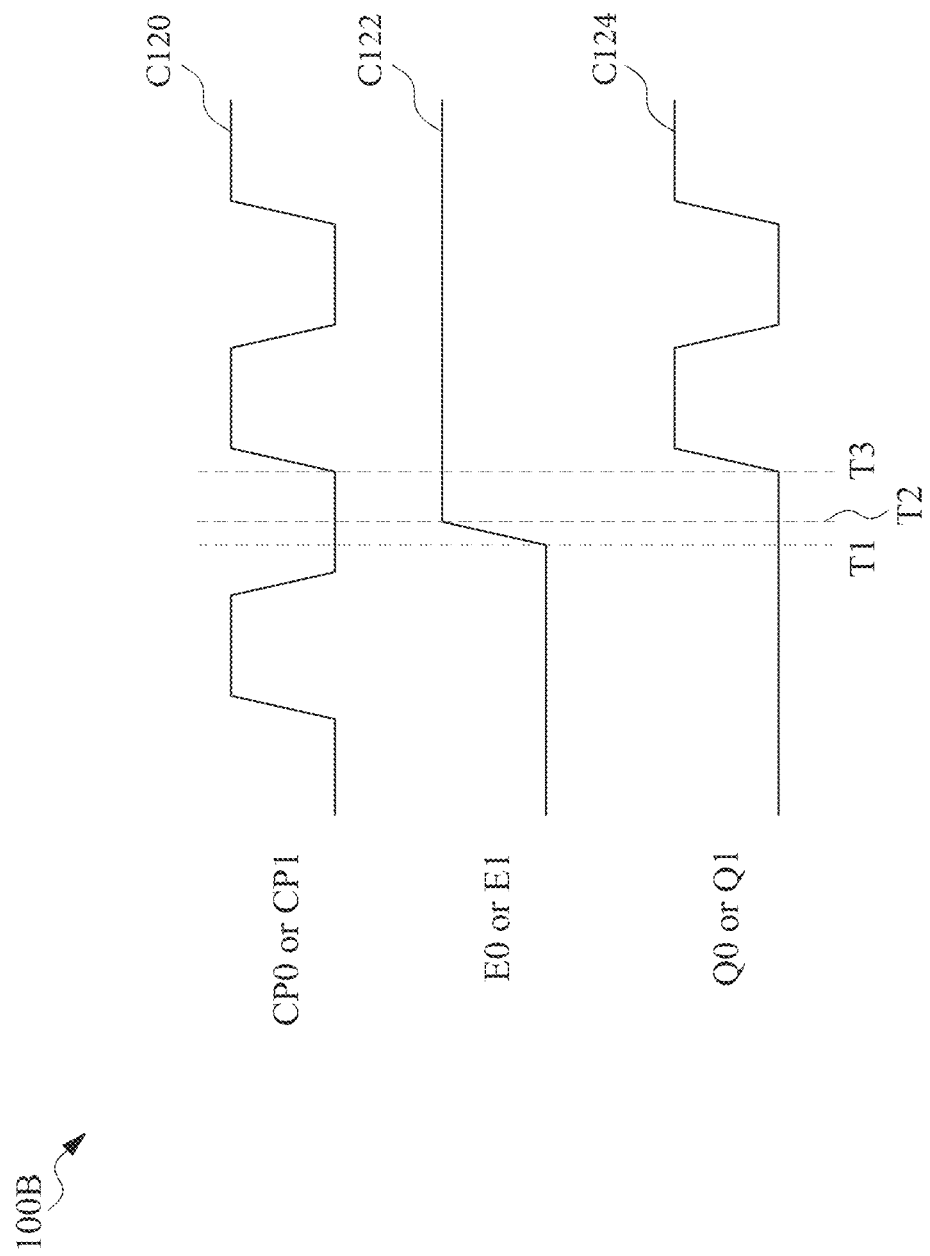
FIG. 1B is a graph of a waveform of a clock gating cell of the integrated circuit of FIG. 1A, in accordance with some embodiments.

FIG. 1B is a graph of a waveform 100B of a clock gating cell 102 or 104 of the integrated circuit 100A of FIG. 1A, in accordance with some embodiments.

Waveform 100B includes curves C120, C122 and C124 of signals in integrated circuit 100A.

In some embodiments, at least curve C120 represents input clock signal CP0 or CP1 of FIG. 1A; at least curve C122 represents enable signal E0 or E1 of FIG. 1A; and curve C124 represents output clock signal Q0 or Q1 of FIG. 1A.

Prior to time T1, curve C122 is a logical 0, and thus clock gating cell 102 or 104 is disabled or deactivated, and curve C124 is fixed with a logical 0. In other words, clock gating cell 102 or 104 is disabled by the enable signal E0 or E1, and the output clock signal Q0 or Q1 is fixed with a logical 0.

At time T1, curve C122 transitions to a logical 1.

At time T2, curve C122 finishes transitioning to a logical 1, thereby causing clock gating cell 102 or 104 to be enabled or activated, and thus allowing the output clock signal Q0 or Q1 (e.g., curve C124) to toggle or oscillate. In other words, clock gating cell 102 or 104 is enabled by the enable signal E0 or E1, and the output clock signal Q0 or Q1 (curve C124) is substantially equal to the input clock signal CP0 or CP1 (curve C120) after time T2.

After time T3, the output clock signal Q0 or Q1 (curve C124) is substantially equal to the input clock signal CP0 or CP1 (curve C120).

Figure 2A:
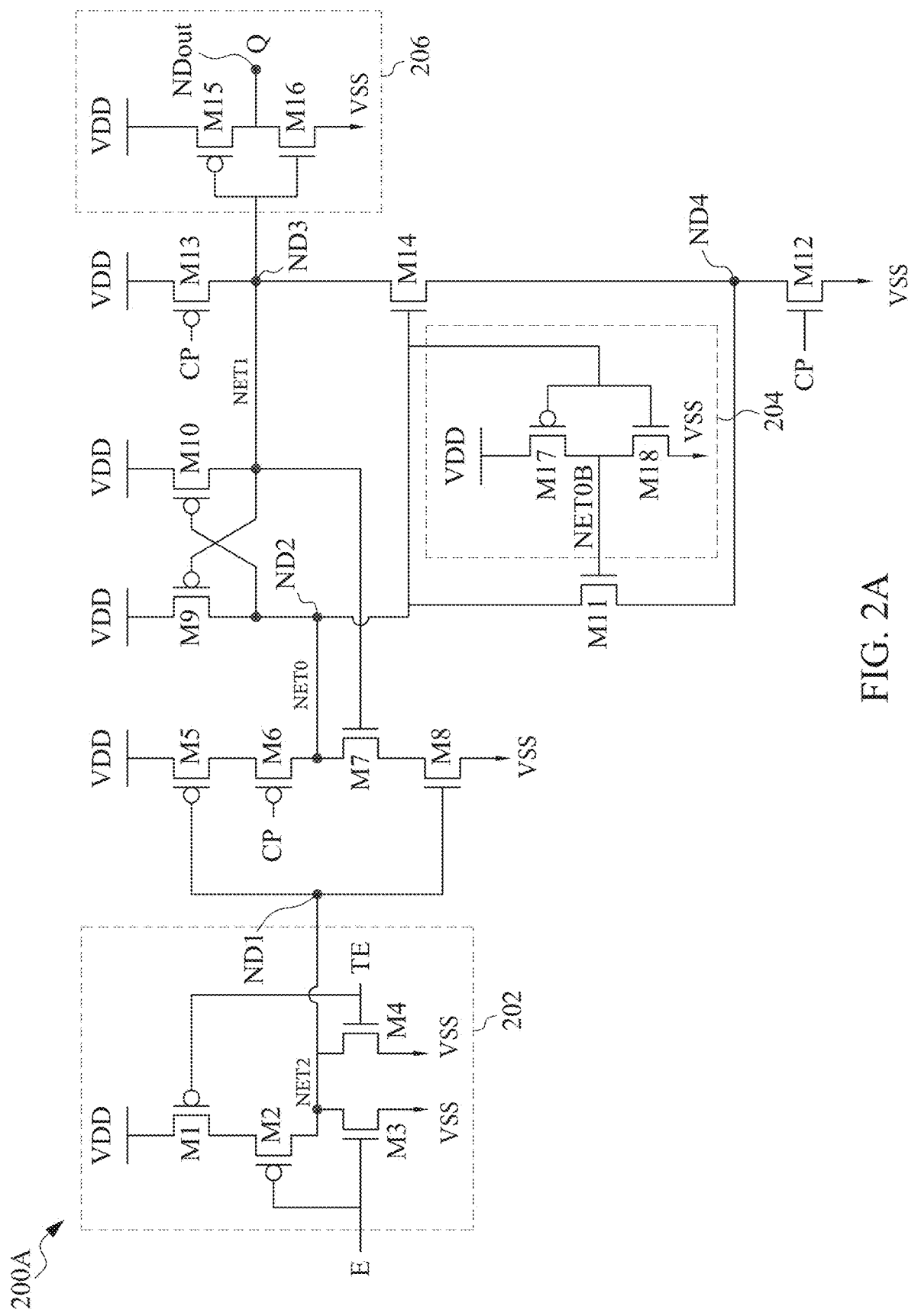
FIG. 2A is a circuit diagram of a clock gating circuit, in accordance with some embodiments.

FIG. 2A is a circuit diagram of a clock gating circuit 200A, in accordance with some embodiments.

Clock gating circuit 200A is an embodiment of at least clock gating circuit 102 or 104 of FIG. 1A, and similar detailed description is omitted. In some embodiments, clock gating circuit 200A is enabled or active with a logically high enable signal E.

Clock gating circuit 200A includes p-type transistors M1, M2, M5, M6, M9, M10 and M13, n-type transistors M3, M4, M7, M8, M11, M12 and M14, and inverters 204 and 206.

In some embodiments, at least one of the n-type transistors of the present disclosure includes an n-type metal-oxide-semiconductor (NMOS) transistor, an n-type fin field effect transistor (FinFET) or another suitable n-type transistor. In some embodiments, at least one of the p-type transistors of the present disclosure includes a p-type metal-oxide-semiconductor (PMOS) transistor, a p-type FinFET or another suitable p-type transistor. Other transistors types are within the scope of the present disclosure.

Input clock signal CP is an embodiment of at least input clock signal CP0 or CP1 of FIG. 1A, output clock signal Q is an embodiment of at least output clock signal Q0 or Q1 of FIG. 1A, enable signal E is an embodiment of at least enable signal E0 or E1 of FIG. 1A, and test enable signal TE is an embodiment of at least test enable signal TE0 or TE1 of FIG. 1A, and similar detailed description is omitted.

Test enable signal TE is a logically low signal or a logically high signal. In some embodiments, test enable signal TE is an external enable signal generated by an external circuit. In some embodiments, during scan testing, at least clock gating circuit 200A or clock gating circuit 300A, 500A or 600A (FIG. 3A, 5A or 6A) is configured to be enabled or activated responsive to test enable signal TE.

Enable signal E is a logically low signal or a logically high signal. In some embodiments, enable signal E is an external enable signal generated by an external circuit. In some embodiments, enable signal E is generated by a different external circuit from test enable signal TE. In some embodiments, enable signal E is generated by a same external circuit as test enable signal TE.

In some embodiments, clock gating circuit 200A is configured to be enabled or activated responsive to enable signal E. In some embodiments, enable signal E has a same function as test enable signal TE, e.g. allowing the input clock signal CP to pass to the output of at least clock gating circuit 200A or clock gating circuit 300A, 500A or 600A (FIG. 3A, 5A or 6A) as output clock signal Q.

Clock gating circuit 200A includes a NOR logic gate 202. NOR logic gate 202 includes p-type transistors M1 and M2, and n-type transistors M3 and M4. A source terminal of p-type transistor M1 is coupled to a voltage supply VDD. A drain terminal of p-type transistor M1 is coupled to a source terminal of p-type transistor M2. Each of a gate terminal of p-type transistor M1 and a gate terminal of n-type transistor M4 are coupled together, and are configured to receive the test enable signal TE.

The source terminal of p-type transistor M2 is coupled to the drain terminal of p-type transistor M1. Each of a gate terminal of p-type transistor M2 and a gate terminal of n-type transistor M3 are coupled together, and are configured to receive the enable signal E. Each of a drain terminal of p-type transistor M2, a drain terminal of n-type transistor M3, a drain terminal of n-type transistor M4, a gate terminal of p-type transistor M5, a gate terminal of n-type transistor M8 and a node ND1 are coupled together. In some embodiments, the signal of node ND1 corresponds to a control signal NET2.

P-type transistors M1 and M2 are configured to selectively couple the voltage supply VDD to node ND1. In some embodiments, p-type transistors M1 and M2 are configured to generate the control signal NET2. In some embodiments, control signal NET2 is a logically low signal or a logically high signal.

A source terminal of n-type transistor M3 and a source terminal of n-type transistor M4 are coupled to a reference voltage supply VSS. In some embodiments, the reference voltage supply VSS is different from the voltage supply VDD. In some embodiments, the source terminal of n-type transistor M3 is coupled to the source terminal of n-type transistor M4.

N-type transistors M3 and M4 are configured to selectively couple the reference voltage supply VSS to node ND1. In some embodiments, n-type transistors M4 and M3 are configured to generate the control signal NET2. In some embodiments, control signal NET2 is inverted from either test enable signal TE or enable signal E.

N-type transistors M3 and M4 and p-type transistors M1 and M2 are arranged as an exemplary NOR logic gate 202. In some embodiments, the control signal NET2 is a NOR output signal, and is generated based on performing a NOR operation on the enable signal E and the test enable signal TE. Other logic types are within the scope of the present disclosure. For example, in some embodiments, a different logic type is substituted for NOR logic gate 202, such as an OR logic gate, an AND logic gate, a NAND logic gate or other suitable logic gates, and transistors M1, M2, M3 and M4 are arranged consistent with these other logic types.

A source terminal of p-type transistor M5 is coupled to the voltage supply VDD. A drain terminal of p-type transistor M5 is coupled to a source terminal of p-type transistor M6. The gate terminal of p-type transistor M5 is coupled to the gate terminal of n-type transistor M8 at node ND1. Each of the gate terminal of p-type transistor M5 and the gate terminal of n-type transistor M8 are configured to receive control signal NET2 from node ND1.

The source terminal of p-type transistor M6 is coupled to the drain terminal of p-type transistor M5. Each of a drain terminal of p-type transistor M6, a drain terminal of n-type transistor M7, a drain terminal of p-type transistor M9, a drain terminal of n-type transistor M11, a gate terminal of n-type transistor M14, a gate terminal of p-type transistor M10, an input terminal of inverter 204 and node ND2 are coupled together. A gate terminal of p-type transistor M6 is configured to receive input clock signal CP. Input clock signal CP selectively enables or turns on p-type transistor M6. In some embodiments, p-type transistors M5 and M6 are configured to generate a control signal NET0 in response to control signal NET2 and clock input signal CP. In some embodiments, the signal of node ND2 corresponds to the control signal NET0.

The drain terminal of n-type transistor M7 is coupled to at least the drain terminal of p-type transistor M6. A source terminal of n-type transistor M7 is coupled to a drain terminal of n-type transistor M8. Each of a gate terminal of n-type transistor M7, a gate terminal of p-type transistor M9, a drain terminal of p-type transistor M10, a drain terminal of p-type transistor M13, a drain terminal of n-type transistor M14, an input terminal of inverter 206, and a node ND3 are coupled together. In some embodiments, a signal of node ND3 corresponds to a control signal NET1. The gate terminal of n-type transistor M7 is configured to receive the control signal NET1.

A source terminal of n-type transistor M8 is coupled to the reference voltage supply VSS. The gate terminal of n-type transistor M8 is configured to receive control signal NET2. In some embodiments, n-type transistors M7 and M8 are configured to generate control signal NET0 in response to control signals NET1 and NET2.

A source terminal of p-type transistor M9 is coupled to the voltage supply VDD. The gate terminal of p-type transistor M9 is configured to receive control signal NET1.

A source terminal of p-type transistor M10 is coupled to the voltage supply VDD. The gate terminal of p-type transistor M10 is configured to receive control signal NET0.

P-type transistors M9 and M10 are cross-coupled to each other. For example, the gate terminal of p-type transistor M9 is coupled to at least the drain of p-type transistor M10 and node ND3. Similarly, the gate terminal of p-type transistor M10 is coupled to at least the drain of p-type transistor M9 and node ND2. In some embodiments, p-type transistor M9 is configured to generate control signal NET0 in response to control signal NET1. In some embodiments, p-type transistor M9 is configured to pull node ND2 towards a voltage of the voltage supply VDD in response to the control signal NET1.

In some embodiments, p-type transistor M10 is configured to generate control signal NET1 in response to control signal NET0. In some embodiments, p-type transistor M10 is configured to pull node ND3 towards a voltage of the voltage supply VDD in response to the control signal NET0.

The drain terminal of n-type transistor M11 is coupled to at least node ND2, the input terminal of inverter 204 and the gate terminal of n-type transistor M14. Each of a source terminal of n-type transistor M11, a drain terminal of n-type transistor M12, a source terminal of n-type transistor M14, and a node ND4 are coupled together. A gate terminal of n-type transistor M11 is coupled to an output terminal of inverter 204. A gate terminal of n-type transistor M11 is configured to receive inverted control signal NET0B. In some embodiments, n-type transistor M11 is configured to electrically couple node ND2 and node ND4 in response to inverted control signal NET0B.

A source terminal of n-type transistor M12 is coupled to reference voltage supply VSS. The drain terminal of n-type transistor M12 is coupled to at least node ND4. A gate terminal of n-type transistor M12 is coupled to a source of input clock signal CP. The gate terminal of n-type transistor M12 is configured to receive input clock signal CP. Input clock signal CP selectively enables or disables n-type transistor M12. In some embodiments, n-type transistor M12 is configured to pull node ND4 towards a voltage of reference voltage supply VSS in response to the input clock signal CP.

A source terminal of p-type transistor M13 is coupled to the voltage supply VDD. The drain terminal of p-type transistor M13 is coupled to at least the gate terminal of n-type transistor M7, the gate terminal of p-type transistor M9, the input terminal of inverter 206 and node ND3. A gate terminal of p-type transistor M13 is configured to receive input clock signal CP. Input clock signal CP selectively enables or disables p-type transistor M13. In some embodiments, p-type transistor M13 is configured to pull node ND3 towards a voltage of the voltage supply VDD in response to the input clock signal CP. In some embodiments, each of the gate terminal of p-type transistor M13, the gate terminal of p-type transistor M6 and the gate terminal of n-type transistor M12 are coupled together.

In some embodiments, p-type transistor M13 is positioned between p-type transistor M15 and at least p-type transistor M10 or p-type transistor M9. In some embodiments, p-type transistor M13 is positioned closer to p-type transistor M15 than at least p-type transistor M10 or p-type transistor M9. In some embodiments, each of the transistors coupled to node ND3 are not dummy transistors. In some embodiments, dummy transistors are not coupled to node ND3 and therefore capacitance on node ND3 is minimized. In some embodiments, a size of one or more transistors of at least clock gating circuit 200A or 300A, 500A, 600A or 700A (described below in FIGS. 3A, 5A, 6A and 7A) can be increased by at least an additional finger in the corresponding transistor resulting in improved driving strength and improved clock slew delay, but also an increase in the occupied area compared with other approaches.

The source terminal of n-type transistor M14 is coupled to at least node ND4. The drain terminal of n-type transistor M14 is coupled to at least node ND3. The gate terminal of n-type transistor M14 is coupled to at least node ND2. The gate terminal of n-type transistor M14 is configured to receive the control signal NET0 from node ND2. Control signal NET0 selectively enables or disables n-type transistor M14. In some embodiments, n-type transistor M14 is configured to electrically couple node ND3 and node ND4 in response to the control signal NET0.

The input terminal of inverter 204 is coupled to at least node ND2. The input terminal of inverter 204 is configured to receive control signal NET0. The output terminal of inverter 204 is coupled to the gate of n-type transistor M11. The output terminal of inverter 204 is configured to generate the inverted control signal NET0B. In some embodiments, the inverted control signal NET0B is inverted from control signal NET0. Inverted control signal NET0B selectively enables or disables n-type transistor M11.

Inverter 204 comprises a p-type transistor M17 and an n-type transistor M18.

A source terminal of p-type transistor M17 is coupled to the voltage supply VDD. Each of a drain terminal of p-type transistor M17, a drain terminal of n-type transistor M18 and the gate terminal of n-type transistor M11 are coupled together. A source terminal of n-type transistor M18 is coupled to the reference voltage supply VSS.

Each of a gate terminal of p-type transistor M17 and a gate terminal of n-type transistor M18 are coupled together, and are configured to receive control signal NET0 from node ND2. Each of the gate terminal of p-type transistor M17 and the gate terminal of n-type transistor M18 are coupled to the drain terminal of n-type transistor M7, the drain terminal of p-type transistor M6, the drain terminal of p-type transistor M9, the drain terminal of n-type transistor M11, the gate terminal of n-type transistor M14, the gate terminal of p-type transistor M10, and node ND2.

The input terminal of inverter 206 is coupled to at least node ND3. The input terminal of inverter 206 is configured to receive control signal NET1. An output terminal of inverter 206 is configured to generate the output clock signal Q. In some embodiments, the output clock signal Q is inverted from control signal NET1. In some embodiments, the output terminal of inverter 206 is coupled to circuitry (not shown) configured to receive the output clock signal Q.

Inverter 206 comprises a p-type transistor M15 and an n-type transistor M16.

A source terminal of p-type transistor M15 is coupled to the voltage supply VDD. Each of a drain terminal of p-type transistor M15, a drain terminal of n-type transistor M16 and an output terminal of clock gating circuit 200A are coupled together. A source terminal of n-type transistor M16 is coupled to the reference voltage supply VSS.

Each of a gate terminal of p-type transistor M15 and a gate terminal of n-type transistor M16 are coupled together, and are configured to receive control signal NET1 from node ND3. Each of the gate terminal of p-type transistor M15 and the gate terminal of n-type transistor M16 are coupled to the drain terminal of p-type transistor M10, the gate terminal of n-type transistor M7, the gate terminal of p-type transistor M9, the drain terminal of p-type transistor M13, the drain terminal of n-type transistor M14 and node ND3.

By utilizing clock gating circuit 200A, a number of transistors, e.g., p-type transistors M6 and M13 and n-type transistor M12, toggled by the input clock signal CP is three. In some embodiments, by utilizing clock gating circuit 200A, the total number of transistors toggled by the input clock signal CP is reduced when compared with other clock gating cells, resulting in clock gating circuit 200A consuming less dynamic clock power than other clock gating cells.

In some embodiments, by utilizing clock gating circuit 200A, the total number of transistors is reduced when compared with other clock gating cells resulting in clock gating circuit 200A occupying less area than other clock gating cells. For example, in some embodiments, by utilizing clock gating circuit 200A, a total number of transistors is less than twenty. In some embodiments, by utilizing clock gating circuit 200A, the total number of transistors is eighteen.

Figure 2B:
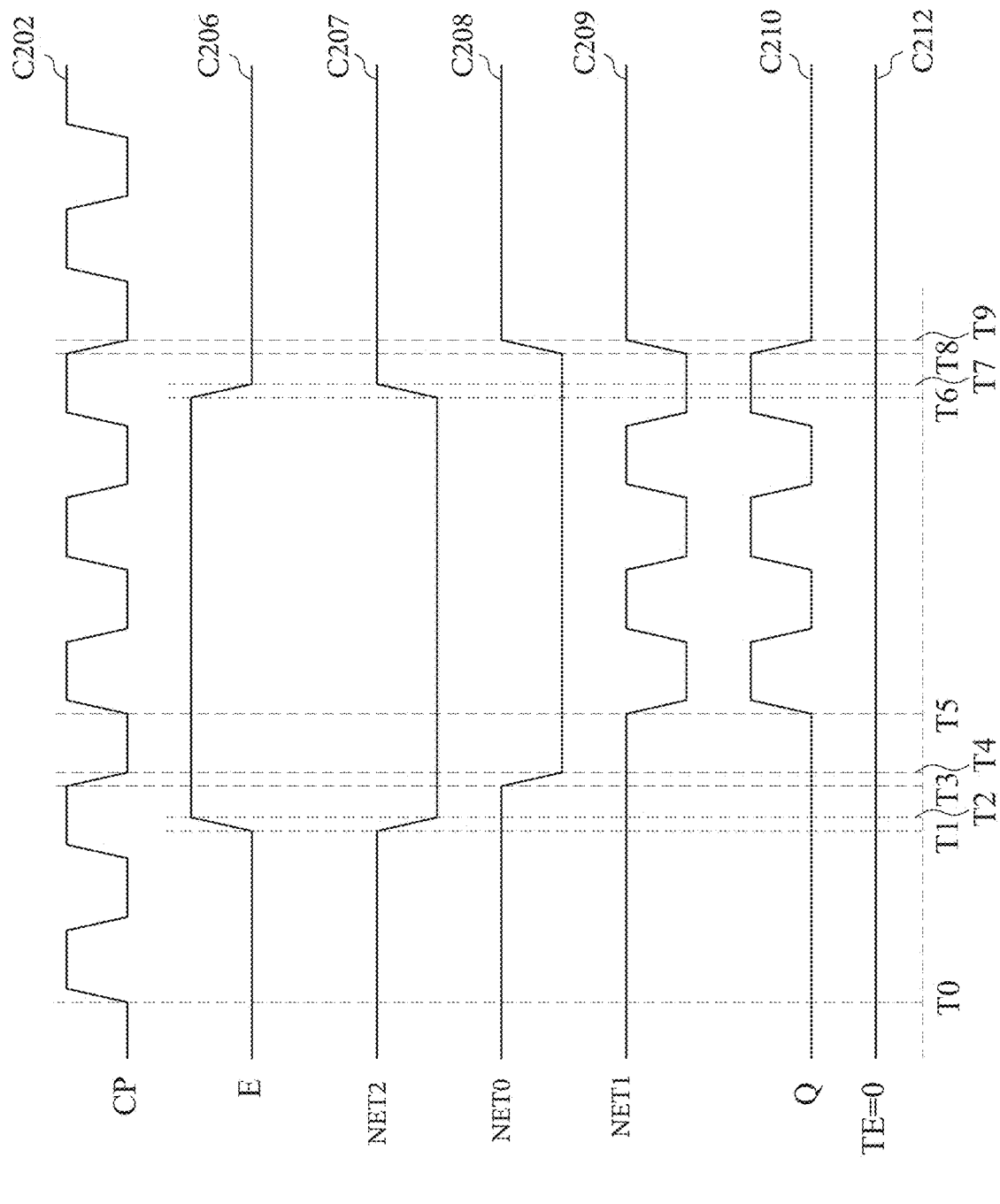
FIG. 2B is a graph of a waveform of the clock gating circuit of FIG. 2A, in accordance with some embodiments.

FIG. 2B is a graph of a waveform 200B of clock gating circuit 200A of FIG. 2A, in accordance with some embodiments.

Waveform 200B includes waveforms of signals when clock gating circuit 200A is initially disabled (e.g., E=0), then enabled (e.g., E=1) and then is disabled (e.g., E=0) again. In this illustration, initially, test enable signal TE is a low logical value, enable signal E is a low logical value, and the output clock signal Q is a low logical value.

In some embodiments, curve C202 represents input clock signal CP of FIG. 2A; curve C206 represents enable signal E; curve C207 represents control signal NET2; curve C208 represents control signal NET0; curve C209 represents control signal NET1; curve C210 represents output clock signal Q; and curve C212 represents test enable signal TE.

Between time T0 and T5, curve C202 will oscillate from a low logic level to a high logic level and vice versa. Between time T0 and T5, curve C210 does not oscillate since the clock gating circuit 200A is disabled by enable signal E being a low logic value. In other words, the clock gating circuit 200A will not pass input clock signal CP as the output clock signal Q.

At time T1, the enable signal E (e.g., curve C206) transitions from a low logical value to a high logical value thereby enabling the clock gating circuit 200A. However, the output clock signal Q (e.g., curve C210) of the clock gating circuit 200A does not mirror the input clock signal CP (e.g., curve C202) until the next positive rising edge (e.g., at time T5).

Between time T5 and T9, at least curve C202 or C210 oscillate inversely from curve C209. Between time T5 and T9, curves C202 and C210 are similar to each other since the clock gating circuit 200A is enabled by enable signal E being a high logic value. In other words, the clock gating circuit 200A will pass input clock signal CP as the output clock signal Q.

After time T9, curve C202 will oscillate from a low logic level to a high logic level and vice versa. After time T9, curve C210 does not oscillate since the clock gating circuit 200A is disabled by enable signal E being a low logic value. In other words, the clock gating circuit 200A will not pass input clock signal CP as the output clock signal Q.

Figure 3A:
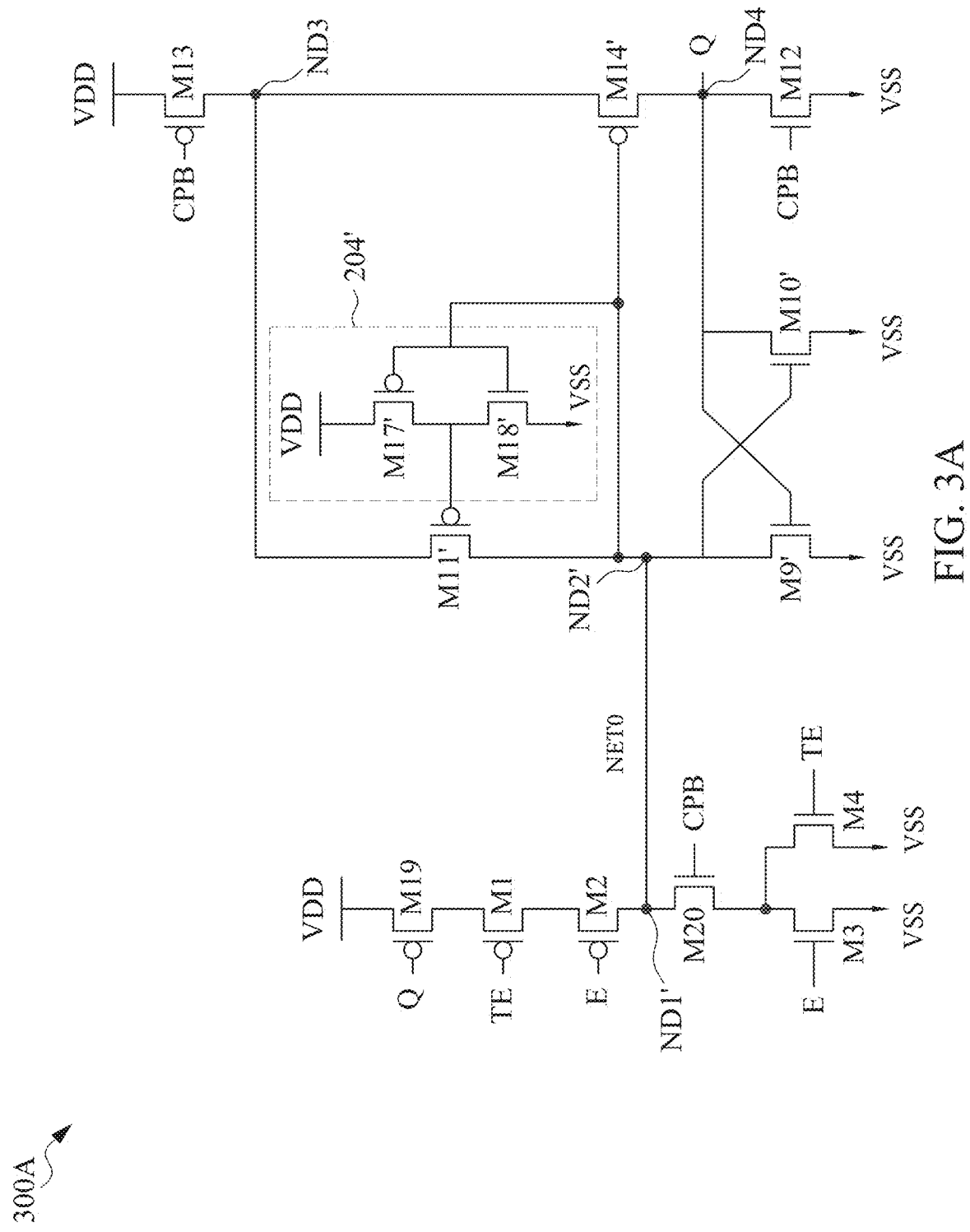
FIG. 3A is a circuit diagram of a clock gating circuit, in accordance with some embodiments.

FIG. 3A is a circuit diagram of a clock gating circuit 300A, in accordance with some embodiments. Clock gating circuit 300A is an embodiment of at least clock gating circuit 102 or 104 of FIG. 1A, and similar detailed description is omitted. In some embodiments, clock gating circuit 300A is enabled or active with a logically high enable signal E.

Components that are the same or similar to those in one or more of FIGS. 1A-1B, 2A-2B, 3A-3B, 4, 5A-5B, 6A-6B, 7A-7B and 8A-8B (shown below) are given the same reference numbers, and detailed description thereof is thus omitted.

Clock gating circuit 300A is a variation of clock gating circuit 200A of FIG. 2A, and similar detailed description is therefore omitted. In comparison with clock gating circuit 200A of FIG. 2A, input clock signal CP of FIG. 2A is replaced with inverted clock signal CPB, and similar detailed description is therefore omitted.

In comparison with clock gating circuit 200A of FIG. 2A, p-type transistors M9 and M10 of FIG. 2A are replaced with corresponding n-type transistors M9' and M10', n-type transistors M11 and M14 of FIG. 2A are replaced with corresponding p-type transistors M11' and M14', inverter 204' replaces inverter 204, nodes ND1 and ND2 are replaced with corresponding nodes ND1' and ND2', and similar detailed description is therefore omitted. In FIG. 3A, node ND1' is directly coupled to node ND2', and therefore node ND2' can be substituted for node ND1', and vice versa, and similar detailed description is omitted for brevity.

In comparison with clock gating circuit 200A of FIG. 2A, clock gating circuit 300A does not include inverter 206, p-type transistors M5, M6, M9 and M10 and n-type transistors M7, M8, M11 and M14.

Clock gating circuit 300A includes p-type transistors M1, M2, M11', M13, M14' and M19, n-type transistors M3, M4, M9', M10', M12 and M20, and inverter 204'.

In comparison with clock gating circuit 200A of FIG. 2A, p-type transistor M19 is coupled between voltage supply VDD and p-type transistor M1. P-type transistors M1, M2 and M19 are configured to selectively couple the voltage supply VDD to node ND1'. In some embodiments, p-type transistors M1, M2 and M19 are configured to generate the control signal NET0.

A source terminal of p-type transistor M19 is coupled to the voltage supply VDD. A drain terminal of p-type transistor M19 is coupled to the source terminal of p-type transistor M1. A gate terminal of p-type transistor M19 is configured to receive the output clock signal Q from node ND4. Each of a gate terminal of p-type transistor M19, node ND4, a gate terminal of n-type transistor M9', a drain terminal of n-type transistor M10', a drain terminal of n-type transistor M12, and a drain terminal of p-type transistor M14' are coupled together.

In comparison with clock gating circuit 200A of FIG. 2A, n-type transistor M20 is coupled between node ND1' and n-type transistors M3 and M4. N-type transistors M3, M4 and M20 are configured to selectively couple the reference voltage supply VSS to node ND1'. In some embodiments, n-type transistor M20 and at least n-type transistor M3 or n-type transistor M4 are configured to generate the control signal NET0.

A source terminal of n-type transistor M20 is coupled to the drain terminal of n-type transistor M3 and the drain terminal of n-type transistor M4. A gate terminal of n-type transistor M20 is configured to receive the inverted clock signal CPB. In some embodiments, the gate terminal of n-type transistor M20 is coupled to the output terminal of inverter 400 of FIG. 4. In some embodiments, each of the gate terminal of n-type transistor M20, the gate terminal of p-type transistor M13 and the gate terminal of n-type transistor M12 are coupled together.

In FIG. 3A, each of a drain terminal of n-type transistor M20, the drain terminal of p-type transistor M2, a drain terminal of n-type transistor M9', a gate terminal of n-type transistor M10', a drain terminal of p-type transistor M11', a gate terminal of p-type transistor M14', an input terminal of inverter 204' (e.g., a gate terminal of p-type transistor M17' and a gate terminal of n-type transistor M18') and node ND2' are coupled together. In some embodiments, the signal of node ND1' or ND2' of FIG. 3A corresponds to the control signal NET0.

By including p-type transistor M19 between voltage supply VDD and p-type transistor M1, and n-type transistor M20 between node ND1' and n-type transistors M3 and M4, p-type transistors M1 and M2 and N-type transistors M3 and M4 are no longer arranged as NOR logic gate 202 of FIG. 2A. In some embodiments, when p-type transistor M19 and n-type transistor M20 are turned on, then p-type transistors M1 and M2 and N-type transistors M3 and M4 are arranged as a NOR logic gate similar to NOR logic gate 202 of FIG. 2A.

A source terminal of n-type transistor M9' is coupled to the reference voltage supply VSS. A gate terminal of n-type transistor M9' is coupled to node ND4, a drain terminal of n-type transistor M10', the drain terminal of n-type transistor M12, and a drain terminal of p-type transistor M14', a gate terminal of p-type transistor M19, and is configured to receive the output clock signal Q. The drain terminal of n-type transistor M9' is coupled to at least a gate terminal of n-type transistor M10' and node ND2' or ND1'.

A source terminal of n-type transistor M10' is coupled to the reference voltage supply VSS. The gate terminal of n-type transistor M10' is coupled to at least the drain terminal of n-type transistor M9' and node ND1' or ND2', and is configured to receive control signal NET0. The drain terminal of n-type transistor M10' is coupled to node ND4, the gate terminal of n-type transistor M9', the drain terminal of n-type transistor M12, the drain terminal of p-type transistor M14' and the gate terminal of p-type transistor M19.

N-type transistors M9' and M10' are cross-coupled to each other. For example, the gate terminal of n-type transistor M9' is coupled to at least the drain of n-type transistor M10' and node ND4. Similarly, the gate terminal of n-type transistor M10' is coupled to at least the drain of n-type transistor M9' and node ND2'. In some embodiments, n-type transistor M9' is configured to generate control signal NET0 in response to the output clock signal Q. In some embodiments, n-type transistor M9' is configured to pull node ND2' towards the voltage of the reference voltage supply VSS in response to the output clock signal Q.

In some embodiments, n-type transistor M10' is configured to generate the output clock signal Q in response to the control signal NET0. In some embodiments, n-type transistor M10' is configured to pull node ND4 towards the voltage of the reference voltage supply VSS in response to the control signal NET0.

The drain terminal of p-type transistor M11' is coupled to at least node ND2', the input terminal of inverter 204' and the gate terminal of n-type transistor M14'. Each of a source terminal of p-type transistor M11', the drain terminal of n-type transistor M13, a source terminal of p-type transistor M14', and node ND3 are coupled together. A gate terminal of p-type transistor M11' is coupled to an output terminal of inverter 204', and is configured to receive inverted control signal NET0B. In some embodiments, p-type transistor M11' is configured to electrically couple node ND3 and node ND2' or ND1' in response to inverted control signal NET0B.

The source terminal of n-type transistor M12 is coupled to reference voltage supply VSS. The drain terminal of n-type transistor M12 is coupled to at least node ND4. The gate terminal of n-type transistor M12 is coupled to a source of inverted clock signal CPB. The gate terminal of n-type transistor M12 is configured to receive inverted clock signal CPB. Inverted clock signal CPB selectively enables or disables n-type transistor M12. In some embodiments, n-type transistor M12 is configured to pull node ND4 towards the voltage of reference voltage supply VSS in response to the inverted clock signal CPB.

The source terminal of p-type transistor M13 is coupled to the voltage supply VDD. The drain terminal of p-type transistor M13 is coupled to the source terminal of p-type transistor M11', the source terminal of p-type transistor M14' and node ND3. The gate terminal of p-type transistor M13 is configured to receive inverted clock signal CPB. Inverted clock signal CPB selectively enables or disables p-type transistor M13. In some embodiments, p-type transistor M13 is configured to pull node ND3 towards a voltage of the voltage supply VDD in response to the inverted clock signal CPB. In some embodiments, each of the gate terminal of p-type transistor M13, the gate terminal of n-type transistor M20 and the gate terminal of n-type transistor M12 are coupled together.

The source terminal of p-type transistor M14' is coupled to at least node ND3. The drain terminal of p-type transistor M14' is coupled to at least node ND4. The gate terminal of p-type transistor M14' is coupled to at least node ND2'. The gate terminal of p-type transistor M14' is configured to receive the control signal NET0 from node ND2'. Control signal NET0 selectively enables or disables p-type transistor M14'. In some embodiments, p-type transistor M14' is configured to electrically couple node ND3 and node ND4 in response to the control signal NET0.

The input terminal of inverter 204' is coupled to at least node ND2'. The input terminal of inverter 204' is configured to receive control signal NET0. The output terminal of inverter 204' is coupled to the gate of p-type transistor M11'. The output terminal of inverter 204' is configured to generate the inverted control signal NET0B. In some embodiments, the inverted control signal NET0B is inverted from control signal NET0. Inverted control signal NET0B selectively enables or disables p-type transistor M11'.

Inverter 204' comprises a p-type transistor M17' and an n-type transistor M18'.

A source terminal of p-type transistor M17' is coupled to the voltage supply VDD. Each of a drain terminal of p-type transistor M17', a drain terminal of n-type transistor M18' and the gate terminal of p-type transistor M11' are coupled together. A source terminal of n-type transistor M18' is coupled to the reference voltage supply VSS.

Each of a gate terminal of p-type transistor M17' and a gate terminal of n-type transistor M18' are coupled together, and are configured to receive control signal NET0 from at least node ND2'. Each of the gate terminal of p-type transistor M17' and the gate terminal of n-type transistor M18' are coupled to the drain terminal of n-type transistor M9', the drain terminal of p-type transistor M11', the gate terminal of p-type transistor M14', the gate terminal of n-type transistor M10', the drain terminal of n-type transistor M20, the drain terminal of p-type transistor M2 and node ND2'.

By utilizing clock gating circuit 300A, a number of transistors, e.g., n-type transistors M20 and M12 and p-type transistor M13, toggled by the inverted clock signal CPB is three. In some embodiments, by utilizing clock gating circuit 300A, the total number of transistors toggled by the inverted clock signal CPB is reduced when compared with other clock gating cells, resulting in clock gating circuit 300A consuming less dynamic clock power than other clock gating cells.

In some embodiments, by utilizing clock gating circuit 300A, the total number of transistors is reduced when compared with other clock gating cells resulting in clock gating circuit 300A occupying less area than other clock gating cells. For example, in some embodiments, by utilizing clock gating circuit 300A, a total number of transistors is less than twenty. In some embodiments, by utilizing clock gating circuit 300A, the total number of transistors is fourteen.

Figure 3B:
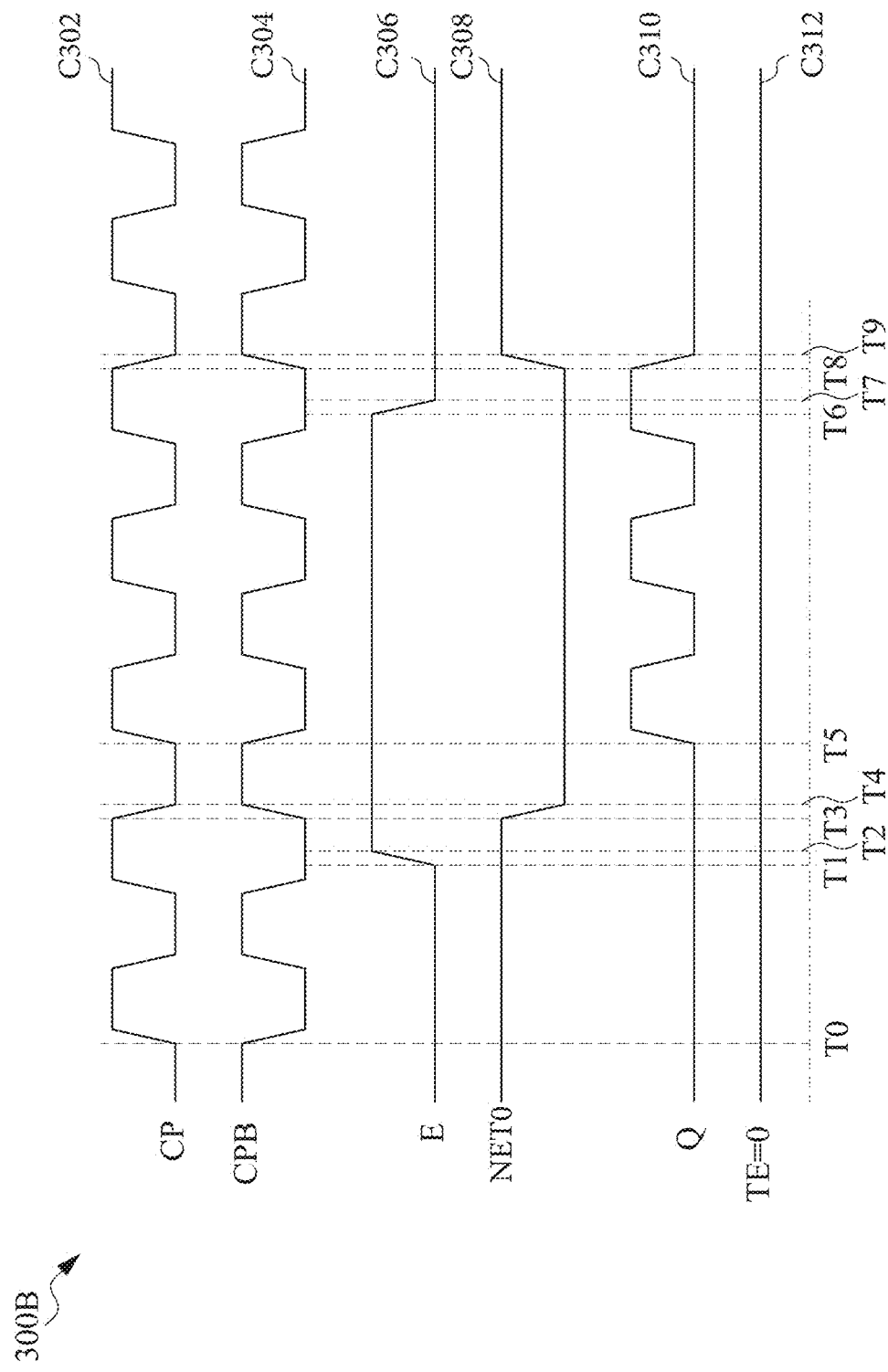
FIG. 3B is a graph of a waveform of the clock gating circuit of FIG. 3A, in accordance with some embodiments.

FIG. 3B is a graph of a waveform 300B of clock gating circuit 300A of FIG. 3A, in accordance with some embodiments.

Waveform 300B includes waveforms of signals when clock gating circuit 300A is initially disabled (e.g., E=0), then enabled (e.g., E=1) and then is disabled (e.g., E=0) again. In this illustration, initially, test enable signal TE is a low logical value, enable signal E is a low logical value, and the output clock signal Q is a low logical value.

In some embodiments, curve C302 represents input clock signal CP of FIG. 3A; curve C304 represents inverted clock signal CPB of FIG. 3A; curve C306 represents enable signal E; curve C308 represents control signal NET0; curve C310 represents output clock signal Q; and curve C312 represents test enable signal TE.

Prior to time T0, curve C302 is a low logical value and curve C304 is a high logical value. Prior to time T0, curves C306, C310 and C312 are a low logical value causing corresponding p-type transistors M2, M19 and M1 to be turned on. As a result, node ND1' and curve C308 are a high logical value. In response to curve C308 being a high logical value causes n-type transistor M10' to be turned on, thereby pulling node ND4 to a low logical value, and setting the output clock signal Q (curve C310) to be a low logical value.

At time T0, curve C302 has a rising edge and begins to transition to a high logical value, and curve C304 has a falling edge and begins to transition to a low logical value causing curve C308 to be held at a high logical value by p-type transistor M13 turning on. In other words, by curve C308 being a high logical value causes n-type transistor M18' to turn on and pull the gate of the p-type transistor M11' low, thereby turning on p-type transistor M11'.

At time T1, curve C302 is a high logical value and curve C304 is a low logical value.

At time T1, curve C306 transitions from a low logical value to a high logical value causing p-type transistor M2 to begin to turn off, and n-type transistor M3 to begin to turn on.

At time T2, curve C306 is a high logical value causing p-type transistor M2 to be turned off, and n-type transistor M3 to be turned on.

At time T3, curve C302 transitions from a high logical value to a low logical value, and curve C304 transitions from a low logical value to a high logical value causing n-type transistor M20 to begin to turn on, thereby electrically coupling node ND1' to the drain of n-type transistor M3, and thus causing curve C308 to transition from a high logical value to a low logical value.

At time T4, curve C302 is a low logical value, curve C304 is a high logical value causing n-type transistor M20 to be turned on. By n-type transistors M20 and M3 being turned on, causes curve C308 to be a low logical value. In response to curve C308 being a low logical value, causes n-type transistors M10' and M18' to turn off, and causing p-type transistor M14' to be turned on, thereby electrically coupling node ND3 to ND4.

At time T5, curve C302 transitions from a low logical value to a high logical value, and curve C304 transitions from a high logical value to a low logical value causing n-type transistor M20 to begin to turn off. At time T5, in response to curve C302 transitioning from a low logical value to a high logical value, and curve C304 transitioning from a high logical value to a low logical value further causes n-type transistor M12 to turn off, and p-type transistor M13 to turn on thereby causing p-type transistor M13 to pull node ND4 and curve C310 to a high logical value. Afterwards, in response to curve C310 being a high logical value causes n-type transistor M9' to be turned on, thereby keeping node ND2' and curve C308 to be a low logical value.

Between time T5 and T6, curve C302 and curve C304 oscillate inversely from each other. Between time T5 and T6, curve C302 and C310 are similar to each other since the clock gating circuit 300A is enabled by enable signal EN being a high logic value. In other words, the clock gating circuit 300A will pass input clock signal CP as the output clock signal Q.

At time T6, curve C306 transitions from a high logical value to a low logical value causing p-type transistor M2 to begin to turn on, and n-type transistor M3 to begin to turn off.

At time T7, curve C306 is a low logical value causing p-type transistor M2 to be turned on, and n-type transistor M3 to be turned off.

At time T8, curve C302 transitions from a high logical value to a low logical value, and curve C304 transitions from a low logical value to a high logical value causing n-type transistor M12 to begin to turn on, thereby causing curve C310 to transition from a high logical value to a low logical value. In response to curve C310 transitioning to a low logical value, p-type transistor M19 begins to turn on thereby causing node ND1' and curve C308 to begin to transition from a low logical value to a high logical value.

At time T9, curve C302 is a low logical value, curve C304 is a high logical value, curve C310 is a low logical value, and curve C308 is a high logical value.

Figure 4:
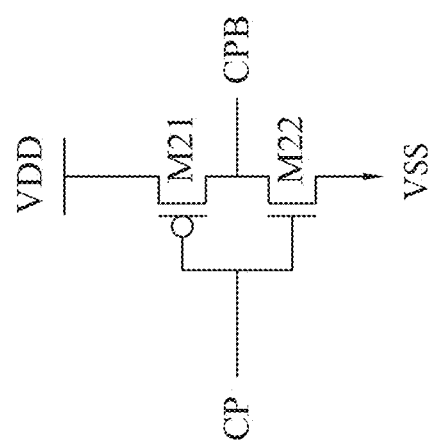
FIG. 4 is a circuit diagram of an inverter 400, in accordance with some embodiments.

FIG. 4 is a circuit diagram of an inverter 400, in accordance with some embodiments.

Figure 5A:
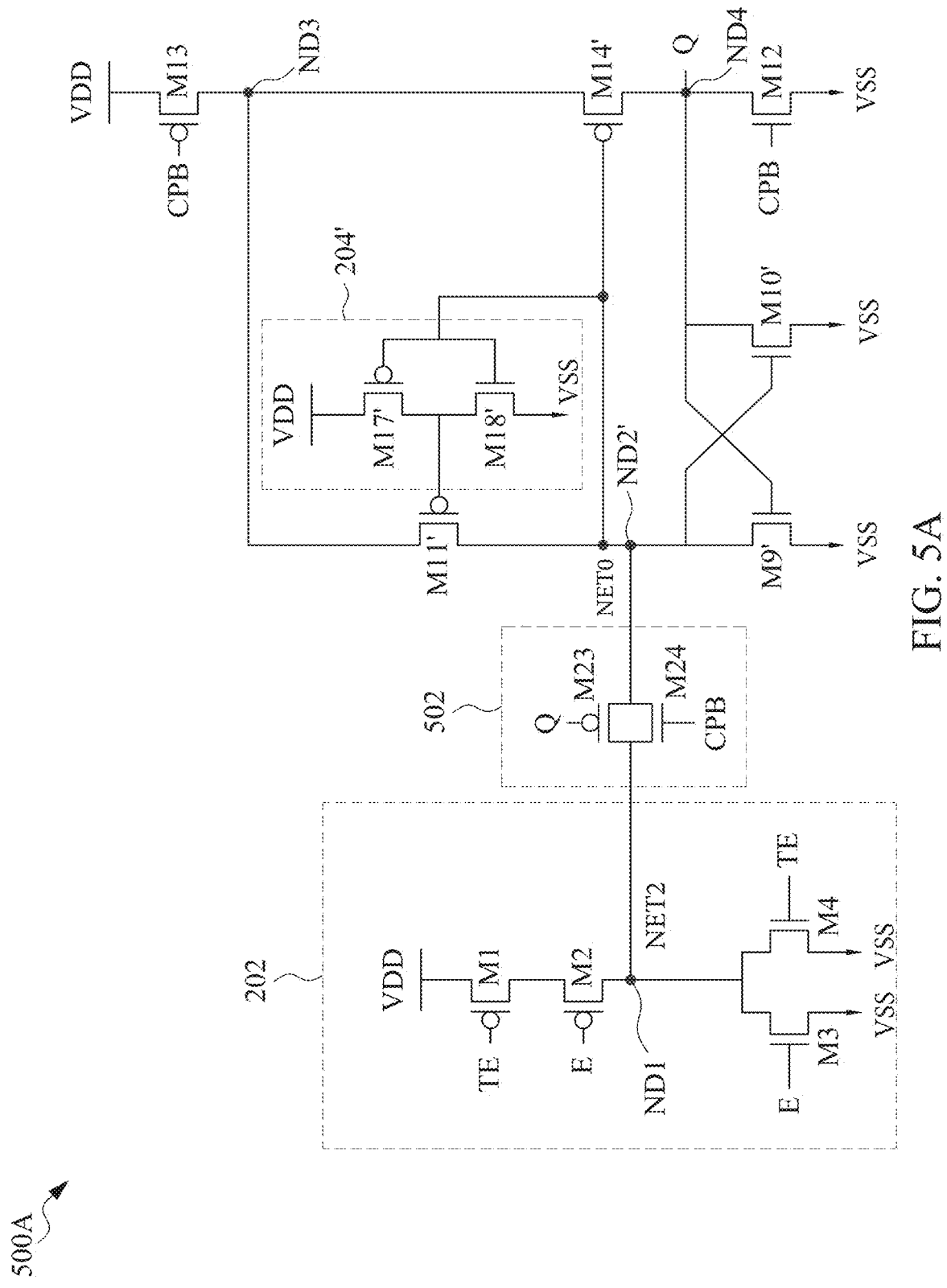
FIG. 5A is a circuit diagram of a clock gating circuit, in accordance with some embodiments.

Inverter 400 is useable in clock gating circuit 300A of FIG. 3A or clock gating circuit 500A of FIG. 5A.

Inverter 400 is configured to generate an inverted clock signal CPB in response to the input clock signal CP. In some embodiments, the inverted clock signal CPB is inverted from the input clock signal CP. An input terminal of inverter 400 is configured to receive the input clock signal CP. An output terminal of inverter 400 is configured to output the inverted clock signal CPB.

Inverter 400 comprises a p-type transistor M21 and an n-type transistor M22.

A source terminal of p-type transistor M21 is coupled to the voltage supply VDD. A drain terminal of p-type transistor M21 is coupled to a drain terminal of n-type transistor M22. In some embodiments, the drain terminal of p-type transistor M21 and the drain terminal of n-type transistor M22 are configured as the output terminal of inverter 400. A source terminal of n-type transistor M22 is coupled to the reference voltage supply VSS.

Each of a gate terminal of p-type transistor M21 and a gate terminal of n-type transistor M22 are coupled together, and are configured to receive the input clock signal CP. In some embodiments, the gate terminal of p-type transistor M21 and the gate terminal of n-type transistor M22 are configured as the input terminal of inverter 400.

In some embodiments, inverter 400 is useable in clock gating circuit 300A of FIG. 3A. For example, in these embodiments, the output terminal of inverter 400 is coupled to p-type transistor M13 and n-type transistors M12 and M20. For example, in these embodiments, the drain terminal of p-type transistor M21 and the drain terminal of n-type transistor M22 are coupled to the gate terminal of p-type transistor M13 and the gate terminals of n-type transistors M12 and M20.

In some embodiments, inverter 400 is useable in clock gating circuit 500A of FIG. 5A. For example, in these embodiments, the output terminal of inverter 400 is coupled to p-type transistor M13 and n-type transistors M12 and M24. For example, in these embodiments, the drain terminal of p-type transistor M21 and the drain terminal of n-type transistor M22 are coupled to the gate terminal of p-type transistor M13 and the gate terminals of n-type transistors M12 and M24.

Other transistors types for inverter 400 are within the scope of the present disclosure.

FIG. 5A is a circuit diagram of a clock gating circuit 500A, in accordance with some embodiments. Clock gating circuit 500A is an embodiment of at least clock gating circuit 102 or 104 of FIG. 1A, and similar detailed description is omitted. In some embodiments, clock gating circuit 500A is enabled or active with a logically high enable signal E.

Clock gating circuit 500A is a variation of clock gating circuit 300A of FIG. 3A, and similar detailed description is therefore omitted. In comparison with clock gating circuit 300A of FIG. 3A, clock gating circuit 500A further includes transmission gate 502, and does not include p-type transistor M19 and n-type transistor M20, and similar detailed description is therefore omitted. Stated differently, p-type transistor M19 and n-type transistor M20 of FIG. 3A are replaced by corresponding similar transistors (e.g., M23 and M24) in transmission gate 502 between nodes ND1 and ND2'. By including transmission gate 502 in clock gating circuit 500A, node ND1 and node ND2' are electrically isolated or coupled to each other by transmission gate 502.

In further comparison with clock gating circuit 300A of FIG. 3A, by not including p-type transistor M19 and n-type transistor M20 in FIG. 5A, p-type transistors M1 and M2 and n-type transistors M3 and M4 of FIG. 5A are configured as the NOR logic gate 202 of FIG. 2A, and node ND1 of FIG. 2A replaces node ND1' of FIG. 3A, and similar detailed description is therefore omitted.

Transmission gate 502 is coupled between at least node ND1 and node ND2'. Transmission gate 502 has a first input terminal configured to receive output clock signal Q, a second input terminal configured to receive inverted clock signal CPB and a third input terminal configured to receive control signal NET2. Transmission gate 502 has an output terminal configured to output control signal NET0.

Transmission gate 502 is configured to couple or decouple node ND1 and node ND2'. Transmission gate 502 is enabled (e.g., turned on) or disabled (e.g., turned off) in response to the output clock signal Q and the inverted clock signal CPB. If enabled, transmission gate 502 is configured to output or pass the control signal NET2 to at least node ND2', and therefore the control signal NET0 is the control signal NET2. If disabled, transmission gate 502 does not pass or output the control signal NET2 to at least node ND2', and therefore the control signal NET0 is electrically isolated from the control signal NET2.

Transmission gate 502 comprises a p-type transistor M23 and an n-type transistor M24. A gate terminal of PMOS transistor M23 is configured to receive the output clock signal Q from node ND4. In FIG. 5A, each of a gate terminal of p-type transistor M23, node ND4, the gate terminal of n-type transistor M9', the drain terminal of n-type transistor M10', the drain terminal of n-type transistor M12, and the drain terminal of p-type transistor M14' are coupled together. A gate terminal of n-type transistor M24 is coupled to at least the output terminal of inverter 400 and is configured to receive the inverted clock signal CPB.

P-type transistor M23 is turned on or off based on the output clock signal Q. N-type transistor M24 is turned on or off based on the inverted clock signal CPB. One of a drain or a source terminal of p-type transistor M23 is coupled to at least one of a drain or a source terminal of n-type transistor M24, and is configured as the third input terminal of transmission gate 502. The other of the drain or the source terminal of p-type transistor M23 is coupled to at least the other of the drain or the source terminal of n-type transistor M23, and is configured as the output terminal of transmission gate 502.

In FIG. 5A, each of the one of the drain or the source terminal of p-type transistor M23, the one of the drain or the source terminal of n-type transistor M24, node ND1, the drain terminal of p-type transistor M2, the drain terminal of n-type transistor M3, and the drain terminal of n-type transistor M4 are coupled together.

In FIG. 5A, each of the other of the drain or the source terminal of p-type transistor M23, the other of the drain or the source terminal of n-type transistor M24, node ND2', the drain terminal of n-type transistor M9', the gate terminal of n-type transistor M10', the drain terminal of p-type transistor M11', the gate terminal of p-type transistor M14', the input terminal of inverter 204' (e.g., the gate terminal of p-type transistor M17' and the gate terminal of n-type transistor M18') are coupled together.

By utilizing clock gating circuit 500A, a number of transistors, e.g., p-type transistor M13 and n-type transistors M12 and M24, toggled by the inverted clock signal CPB is three. In some embodiments, by utilizing clock gating circuit 500A, the total number of transistors toggled by the inverted clock signal CPB is reduced when compared with other clock gating cells, resulting in clock gating circuit 500A consuming less dynamic clock power than other clock gating cells.

In some embodiments, by utilizing clock gating circuit 500A, the total number of transistors is reduced when compared with other clock gating cells resulting in clock gating circuit 500A occupying less area than other clock gating cells. For example, in some embodiments, by utilizing clock gating circuit 500A, a total number of transistors is less than twenty. In some embodiments, by utilizing clock gating circuit 500A, the total number of transistors is fourteen.

Figure 5B:
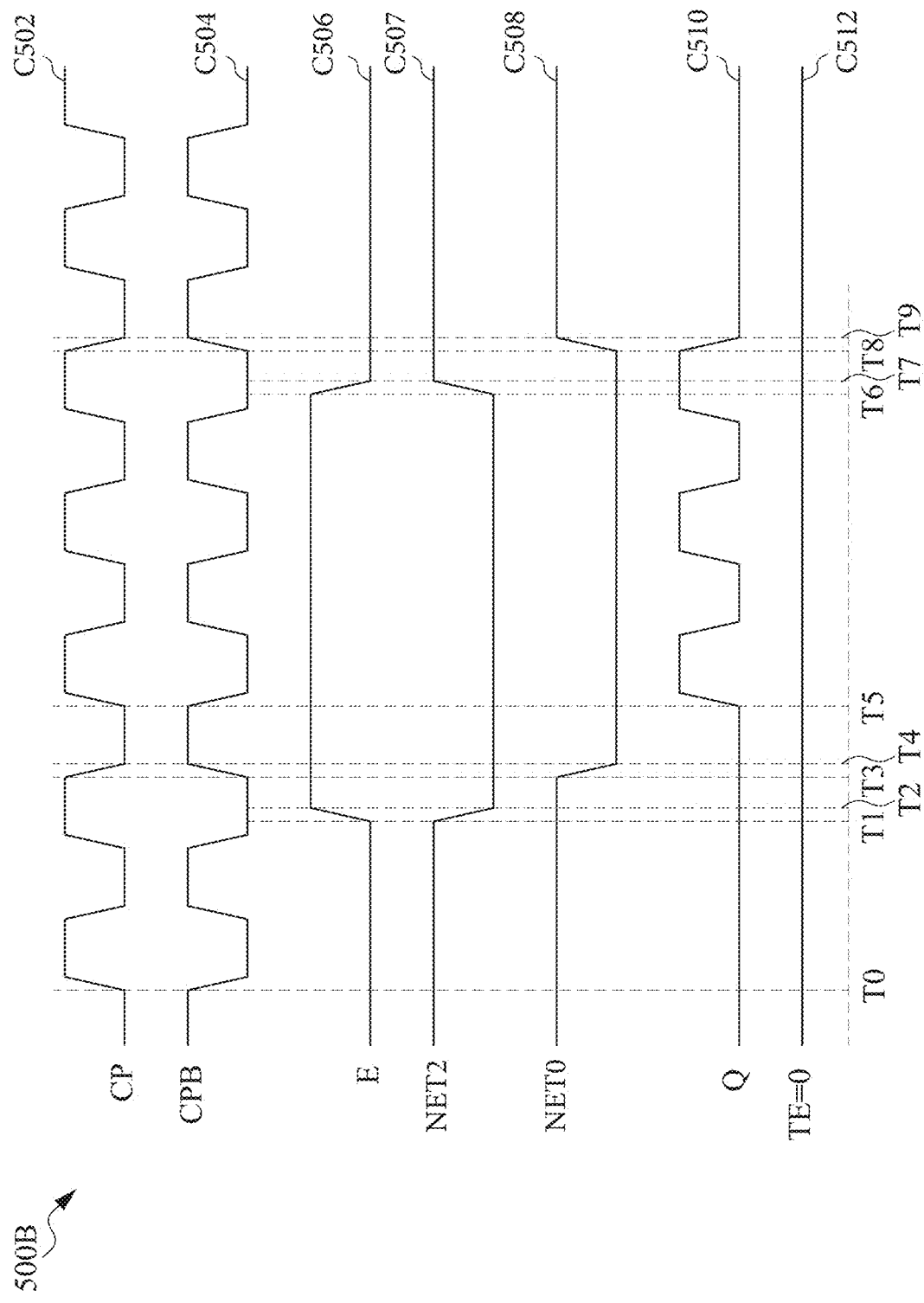
FIG. 5B is a graph of a waveform of the clock gating circuit of FIG. 5A, in accordance with some embodiments.

FIG. 5B is a graph of a waveform 500B of clock gating circuit 500A of FIG. 5A, in accordance with some embodiments.

Waveform 500B includes waveforms of signals when clock gating circuit 500A is initially disabled (e.g., E=0), then enabled (e.g., E=1) and then is disabled (e.g., E=0) again. In this illustration, initially, test enable signal TE is a low logical value, enable signal E is a low logical value, and the output clock signal Q is a low logical value.

In some embodiments, curve C502 represents input clock signal CP of FIG. 5A; curve C504 represents inverted clock signal CPB of FIG. 5A; curve C506 represents enable signal E; curve C507 represents control signal NET2; curve C508 represents control signal NET0; curve C510 represents output clock signal Q; and curve C512 represents test enable signal TE.

Prior to time T0, curve C502 is a low logical value, curve C504 is a high logical value and curve C510 is a low logical value. Prior to time T0, curves C506 and C512 are a low logical value causing corresponding p-type transistors M2 and M1 to be turned on. As a result, node ND1 and curve C507 are a high logical value. In response to curve C504 being a high logical value and curve C510 being a low logical value causes corresponding n-type transistor M24 and corresponding p-type transistor M23 to each be turned on, thereby electrically coupling node ND1 and ND2' and causing curves C507 and C508 to be equal. In response to curve C508 being a high logical value causes n-type transistor M10' to be turned on, thereby pulling node ND4 to a low logical value, and setting the output clock signal Q (curve C510) to be a low logical value.

At time T0, curve C502 has a rising edge and begins to transition to a high logical value, and curve C504 has a falling edge and begins to transition to a low logical value causing curve C508 to be held at a high logical value by p-type transistor M13 turning on. In other words, by curve C508 being a high logical value causes n-type transistor M18' to turn on and pull the gate of the p-type transistor M11' low, thereby turning on p-type transistor M11'.

At time T1, curve C502 is a high logical value and curve C504 is a low logical value.

At time T1, curve C506 transitions from a low logical value to a high logical value causing p-type transistor M2 to begin to turn off, and n-type transistor M3 to begin to turn on thereby causing curve C507 to transition from a high logical value to a low logical value. However, since curve C504 is a low logical value causes n-type transistor M24 to be turned off, and curve C508 does not transition yet to a low logical value.

At time T2, curve C506 is a high logical value causing p-type transistor M2 to be turned off, and n-type transistor M3 to be turned on, thereby causing curve C507 to be a low logical value.

At time T3, curve C502 transitions from a high logical value to a low logical value, and curve C504 transitions from a low logical value to a high logical value causing n-type transistor M24 to begin to turn on, thereby allowing n-type transistor M3 to pull node ND2' to a low logical value, and thus causing curve C508 to transition from a high logical value to a low logical value.

At time T4, curve C502 is a low logical value, curve C504 is a high logical value causing n-type transistor M24 to be turned on. By n-type transistors M24 and M3 being turned on, causes curve C508 to be a low logical value. In response to curve C508 being a low logical value, causes n-type transistors M10' and M18' to turn off, and causing p-type transistor M14' to be turned on, thereby electrically coupling node ND3 to ND4.

At time T5, curve C502 transitions from a low logical value to a high logical value, and curve C504 transitions from a high logical value to a low logical value causing n-type transistor M24 to begin to turn off. At time T5, in response to curve C502 transitioning from a low logical value to a high logical value, and curve C504 transitioning from a high logical value to a low logical value further causes n-type transistor M12 to turn off, and p-type transistor M13 to turn on thereby causing p-type transistor M13 to pull node ND4 and curve C510 to a high logical value. Afterwards, in response to curve C510 being a high logical value causes n-type transistor M9' to be turned on, thereby keeping node ND2' and curve C508 to be a low logical value. In further response to curve C510 being a high logical value causes p-type transistor M23 to be turned off.

Between time T5 and T6, curve C502 and curve C504 oscillate inversely from each other. Between time T5 and T6, curve C502 and C510 are similar to each other since the clock gating circuit 500A is enabled by enable signal EN being a high logic value. In other words, the clock gating circuit 500A will pass input clock signal CP as the output clock signal Q.

At time T6, curve C506 transitions from a high logical value to a low logical value causing p-type transistor M2 to begin to turn on, and n-type transistor M3 to begin to turn off thereby causing curve C507 to transition from a low logical value to a high logical value. However, since curve C510 is a high logical value thereby causes p-type transistor M23 to be turned off, and curve C508 does not transition yet to a high logical value.

At time T7, curve C506 is a low logical value causing p-type transistor M2 to be turned on, and n-type transistor M3 to be turned off, thereby causing curve C507 to be a high logical value.

At time T8, curve C502 transitions from a high logical value to a low logical value, and curve C504 transitions from a low logical value to a high logical value causing n-type transistor M12 to begin to turn on, thereby causing curve C510 to transition from a high logical value to a low logical value. In response to curve C510 transitioning to a low logical value, p-type transistor M23 begins to turn on thereby causing node ND2' and curve C508 to begin to transition from a low logical value to a high logical value by p-type transistors M1 and M2.

At time T9, curve C502 is a low logical value, curve C504 is a high logical value, curve C510 is a low logical value, and curve C508 is a high logical value.

Figure 6A:
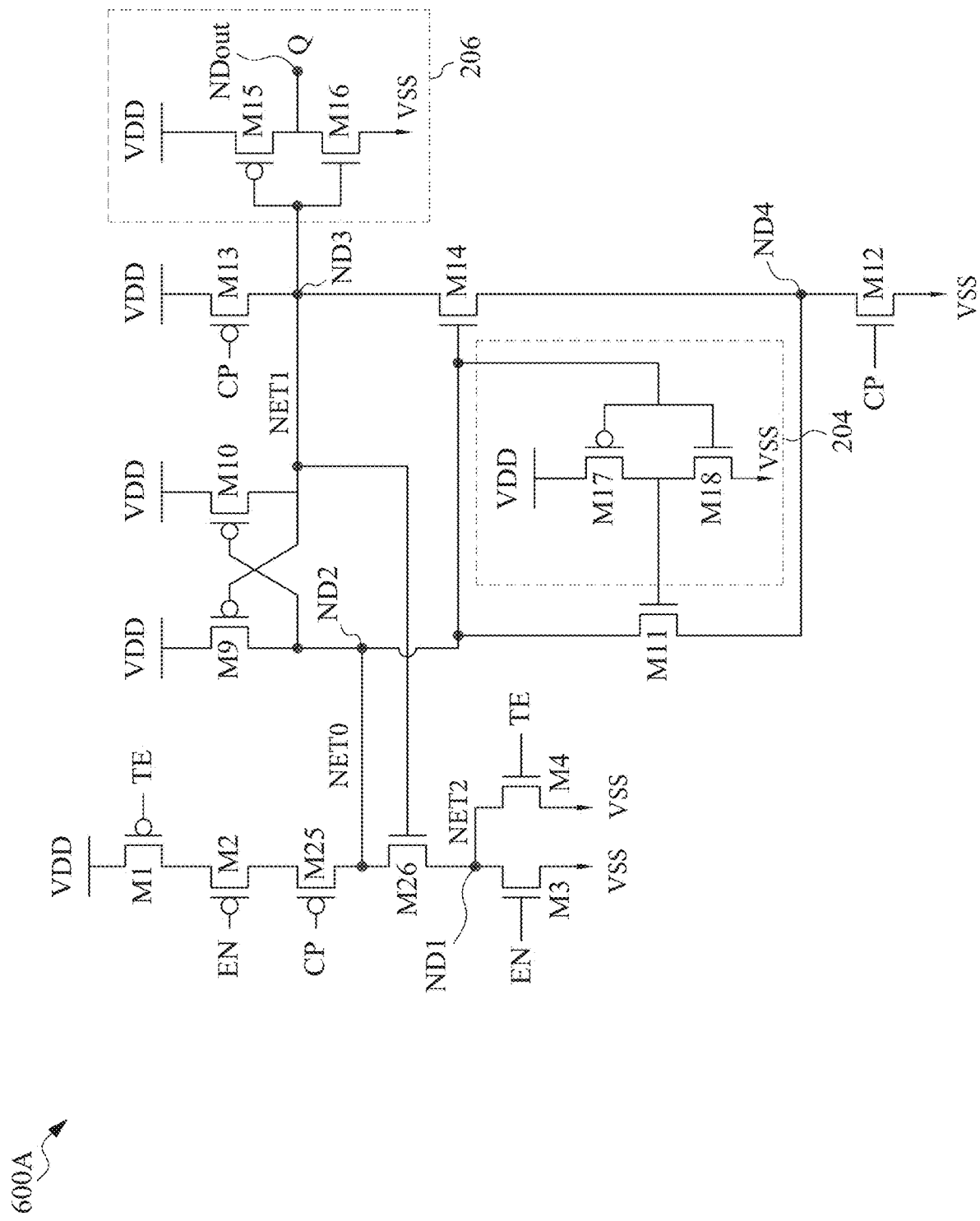
FIG. 6A is a circuit diagram of a clock gating circuit, in accordance with some embodiments.

FIG. 6A is a circuit diagram of a clock gating circuit 600A, in accordance with some embodiments. Clock gating circuit 600A is an embodiment of at least clock gating circuit 102 or 104 of FIG. 1A, and similar detailed description is omitted.

Clock gating circuit 600A is a variation of clock gating circuit 200A of FIG. 2A, and similar detailed description is therefore omitted. In some embodiments, clock gating circuit 600A is enabled or active with a logically low enable signal EN. In other words, clock gating circuit 600A is enabled with an active low enable signal (e.g., enable signal EN). In comparison with clock gating circuit 200A of FIG. 2A, enable signal E of FIG. 2A is replaced with enable signal EN of clock gating circuit 600A, and similar detailed description is therefore omitted. In some embodiments, enable signal EN is inverted from enable signal E. Each of the gate terminal of p-type transistor M2 and the gate terminal of n-type transistor M3 are configured to receive enable signal EN.

In comparison with clock gating circuit 200A of FIG. 2A, clock gating circuit 600A does not include p-type transistors M5 and M6 and n-type transistors M7 and M8, but further includes a p-type transistor M25 and an n-type transistor M26, and similar detailed description is therefore omitted.

By not including p-type transistors M5 and M6 and n-type transistors M7 and M8, node ND2 is coupled to a drain terminal of p-type transistor M25 and a drain terminal of n-type transistor M26. In some embodiments, the functional features of p-type transistor M6 and n-type transistor M7 are incorporated into a corresponding p-type transistor M25 and a corresponding n-type transistor M26.

Clock gating circuit 600A includes p-type transistors M1, M2, M9, M10, M13 and M25, n-type transistors M3, M4, M11, M12, M14 and M26, and inverters 204 and 206.

P-type transistor M25 is coupled between node ND2 and p-type transistor M2. In FIG. 6A, the signal of node ND2 corresponds to the control signal NET0. P-type transistors M1, M2 and M25 are configured to selectively couple the voltage supply VDD to node ND2 in response to test enable signal TE, enable signal EN and input clock signal CP. In some embodiments, p-type transistors M1, M2 and M25 are configured to generate the control signal NET0 in response to test enable signal TE, enable signal EN and input clock signal CP.

A source terminal of p-type transistor M25 is coupled to the drain terminal of p-type transistor M2. A gate terminal of p-type transistor M25 is configured to receive the input clock signal CP. In some embodiments, each of the gate terminal of p-type transistor M25, the gate terminal of p-type transistor M13 and the gate terminal of n-type transistor M12 are coupled together. In FIG. 6A, each of a drain terminal of p-type transistor M25, a drain terminal of n-type transistor M26, the drain terminal of p-type transistor M9, the gate terminal of p-type transistor M10, the drain terminal of n-type transistor M11, the gate terminal of n-type transistor M14, the input terminal of inverter 204 and node ND2 are coupled together.

N-type transistor M26 is coupled between node ND2 and at least node ND1, n-type transistor M3 or N-type transistor M4. In FIG. 6A, the signal of node ND1 corresponds to the control signal NET2.

Control signal NET1 selectively enables or disables n-type transistor M26. In some embodiments, n-type transistor M26 is configured to electrically couple node ND2 and node ND1 in response to the control signal NET1. In FIG. 6A, the signal of node ND3 corresponds to the control signal NET1.

N-type transistors M3, M4 and M26 are configured to selectively couple the reference voltage supply VSS to node ND2 in response to control signal NET1 and at least test enable signal TE or enable signal EN. In some embodiments, n-type transistor M26 and at least n-type transistor M3 or n-type transistor M4 are configured to generate the control signal NET0 in response to control signal NET1 and at least test enable signal TE or enable signal EN.

In FIG. 6A, each of a source terminal of n-type transistor M26, the drain terminal of n-type transistor M3, the drain terminal of n-type transistor M4 and node ND1 are coupled together. A gate terminal of n-type transistor M26 is configured to receive the control signal NET1.

In FIG. 6A, each of the gate terminal of n-type transistor M26, the gate terminal of p-type transistor M9, the drain terminal of p-type transistor M10, the drain terminal of p-type transistor M13, the drain terminal of n-type transistor M14, the input terminal of inverter 206 (e.g., each of the gate terminal of p-type transistor M15 and the gate terminal of n-type transistor M16), and node ND3 are coupled together.

By including p-type transistor M25 and n-type transistor M26 between p-type transistors M1 and M2 and n-type transistors M3 and M4, then p-type transistors M1 and M2 and n-type transistors M3 and M4 are no longer arranged as NOR logic gate 202 of FIG. 2A. In some embodiments, when p-type transistor M25 and n-type transistor M26 are turned on, then p-type transistors M1 and M2 and N-type transistors M3 and M4 of FIG. 6A are arranged as a NOR logic gate similar to NOR logic gate 202 of FIG. 2A.

By utilizing clock gating circuit 600A, a number of transistors, e.g., p-type transistors M25 and M13 and n-type transistor M12, toggled by the input clock signal CP is three. In some embodiments, by utilizing clock gating circuit 600A, the total number of transistors toggled by the input clock signal CP is reduced when compared with other clock gating cells, resulting in clock gating circuit 600A consuming less dynamic clock power than other clock gating cells.

In some embodiments, by utilizing clock gating circuit 600A, the total number of transistors is reduced when compared with other clock gating cells resulting in clock gating circuit 600A occupying less area than other clock gating cells. For example, in some embodiments, by utilizing clock gating circuit 600A, a total number of transistors is less than twenty. In some embodiments, by utilizing clock gating circuit 600A, the total number of transistors is sixteen.

Figure 6B:
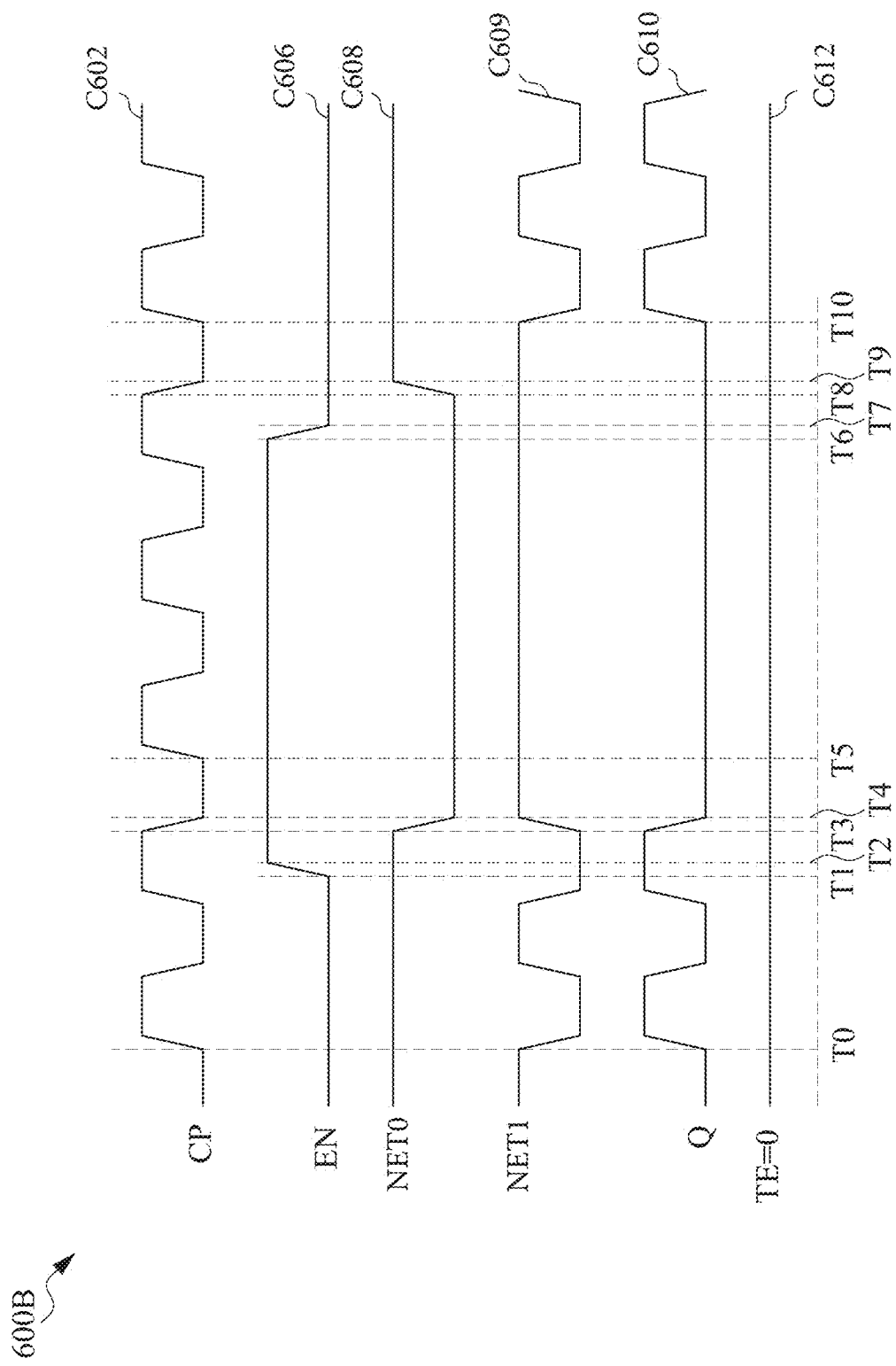
FIG. 6B is a graph of a waveform of the clock gating circuit of FIG. 6A, in accordance with some embodiments.

FIG. 6B is a graph of a waveform 600B of clock gating circuit 600A of FIG. 6A, in accordance with some embodiments.

Waveform 600B includes waveforms of signals when clock gating circuit 600A is initially enabled (e.g., EN=0), then disabled (e.g., EN=1) and then is enabled (e.g., EN=0) again. In this illustration, initially, test enable signal TE is a low logical value, enable signal EN is a low logical value, and the output clock signal Q is a low logical value.

In some embodiments, curve C602 represents input clock signal CP of FIG. 6A; curve C606 represents enable signal EN; curve C608 represents control signal NET0; curve C609 represents control signal NET1; curve C610 represents output clock signal Q; and curve C612 represents test enable signal TE.

Prior to time T0, curve C602 is a low logical value causing p-type transistors M25 and M13 to be turned on. Prior to time T0, curves C606 and C612 are a low logical value causing corresponding p-type transistors M2 and M1 to be turned on. In response to p-type transistors M25, M2 and M1 being turned on causes curve C608 to be a high logical value. In response to p-type transistor M13 being turned on causes curve C609 to be a high logical value, thereby setting the output clock signal Q (curve C610) to be a low logical value. In response to curve C608 being a high logical value, causes n-type transistor M14 to be turned on, thereby electrically coupling node ND3 to node ND4.

Between time T0 and T4 (or beyond time T10), at least curve C602 or C610 oscillate inversely from curve C609. Between time T0 and T4 (or beyond time T10), curve C602 and C610 are similar to each other since the clock gating circuit 600A is enabled by enable signal EN being a low logic value. In other words, the clock gating circuit 600A will pass input clock signal CP as the output clock signal Q.

At time T0, curve C602 has a rising edge and begins to transition to a high logical value causing n-type transistor M12 to begin to turn on, thereby causing p-type transistor M13 to turn-off, and thereby causing node ND3 and curve C609 to begin to transition from a high logical value to a low logical value. In response to curve C609 transitioning from a high logical value to a low logical value, causes curve C610 to begin to transition from a low logical value to a high logical value. In response to curve C609 transitioning from a high logical value to a low logical value, causes p-type transistor M9 to begin to turn on, thereby keeping curve C608 at a high logical value.

At time T1, curve C606 transitions from a low logical value to a high logical value causing p-type transistor M2 to begin to turn off, and n-type transistor M3 to begin to turn on. However, since curve C609 is a low logical value causes n-type transistor M26 to be turned off, and curve C608 does not transition yet to a low logical value.

At time T2, curve C606 is a high logical value causing p-type transistor M2 to be turned off, and n-type transistor M3 to be turned on.

At time T3, curve C602 transitions from a high logical value to a low logical value, causing p-type transistor M13 to begin to turn on, thereby causing curve C609 to transition from a low logical value to a high logical value. In response to curve C609 transitioning from a low logical value to a high logical value, causes curve C610 to begin to transition from a high logical value to a low logical value. In response to curve C609 transitioning from a low logical value to a high logical value, causes p-type transistor M9 to begin to turn off, and causes n-type transistor M26 to begin to turn on. In response to n-type transistor M26 beginning to turn on causes curve C608 to begin to transition from a high logical value to a low logical value.

In response to curve C608 beginning to transition from a high logical value to a low logical value causes p-type transistor M17 to turn on, thereby pulling the gate of p-type transistor M11 to a high logical value, thereby turning on n-type transistor M11, and electrically coupling node ND2 to node ND4.

At time T4, curve C602 is a low logical value, curve C609 is a high logical value, curve C610 is a low logical value, and curve C608 is a low logical value.

At time T5, curve C602 begins to transition from a low logical value to a high logical value, but since the clock gating circuit 600A is disabled by enable signal EN being a high logic value, causes the output clock signal Q to remain at a low logical value.

Between time T5 and T6, curve C610 remains at a low logic value.

At time T6, curve C606 transitions from a high logical value to a low logical value causing p-type transistor M2 to begin to turn on, and n-type transistor M3 to begin to turn off However, since curve C602 is a high logical value causes p-type transistor M25 to be turned off, and curve C608 does not transition yet to a high logical value.

At time T7, curve C606 is a low logical value causing p-type transistor M2 to be turned on, and n-type transistor M3 to be turned off.

At time T8, curve C602 transitions from a high logical value to a low logical value, causing p-type transistor M25 to begin to turn on. In response to p-type transistors M25, M2 and M1 being turned on causes curve C608 to transition from a low logical value to a high logical value.

At time T9, curve C602 is a low logical value, p-type transistor M25 is turned on, and curve C608 is a high logical value.

At time T10, curve C602 transitions from a low logical value to a high logical value, is similar to the discussion above for time T0, and similar detailed description is omitted.

Beyond time T10, curve C602 and C610 are similar to each other since the clock gating circuit 600A is enabled by enable signal EN being a low logic value. In other words, the clock gating circuit 600A will pass input clock signal CP as the output clock signal Q.

Figure 7A:
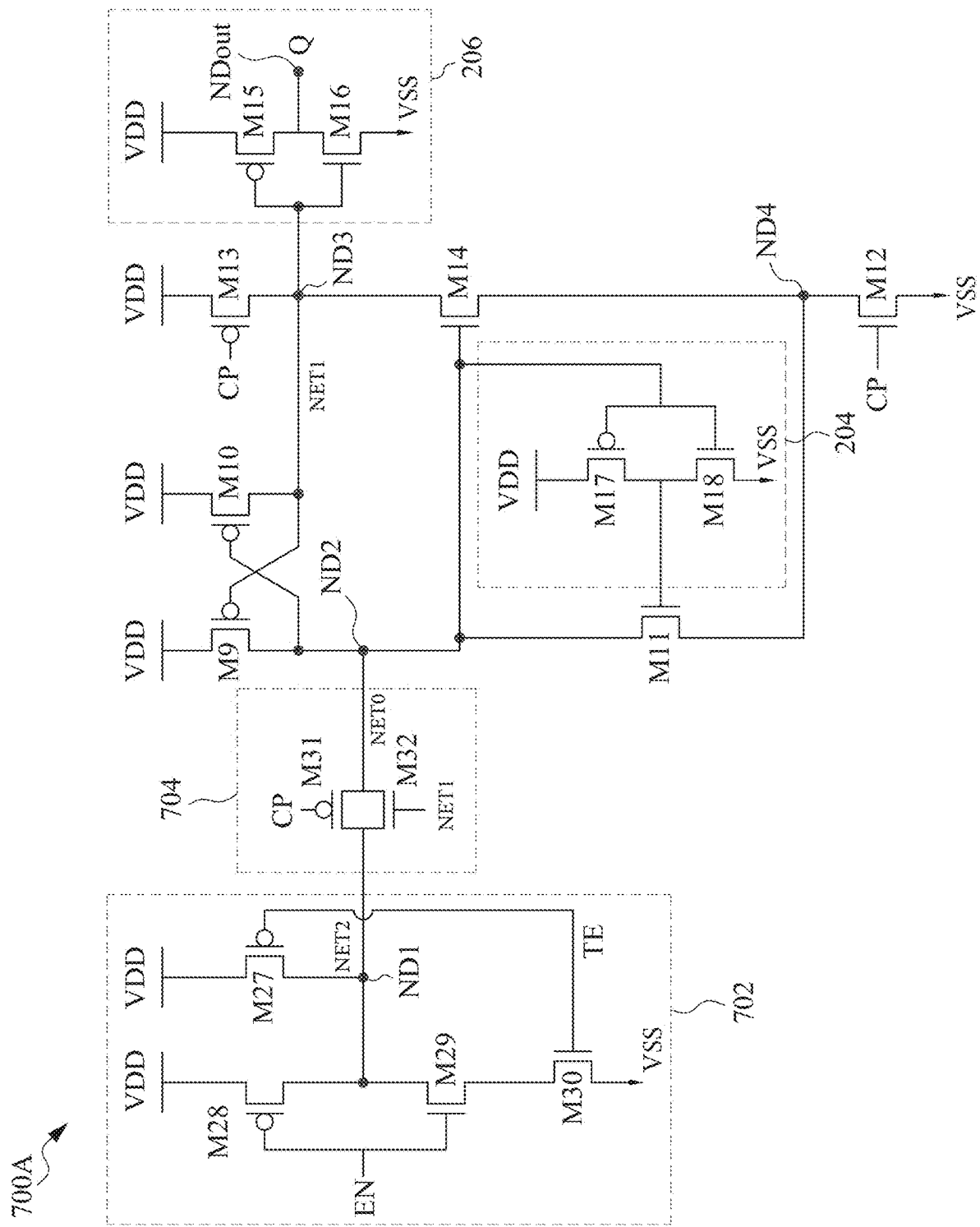
FIG. 7A is a circuit diagram of a clock gating circuit, in accordance with some embodiments.

FIG. 7A is a circuit diagram of a clock gating circuit 700A, in accordance with some embodiments. Clock gating circuit 700A is an embodiment of at least clock gating circuit 102 or 104 of FIG. 1A, and similar detailed description is omitted.

Clock gating circuit 700A is a variation of clock gating circuit 200A of FIG. 2A, and similar detailed description is therefore omitted. In some embodiments, clock gating circuit 700A is enabled or active with a logically low enable signal EN. In other words, clock gating circuit 700A is enabled with an active low enable signal (e.g., enable signal EN). In comparison with clock gating circuit 200A of FIG. 2A, enable signal E of FIG. 2A is replaced with enable signal EN of clock gating circuit 700A, and similar detailed description is therefore omitted. In some embodiments, enable signal EN is inverted from enable signal E.

In comparison with clock gating circuit 200A of FIG. 2A, a NAND logic gate 702 of FIG. 7A replaces the NOR logic gate 202, a transmission gate 704 replaces p-type transistors M5 and M6 and n-type transistors M7 and M8, and similar detailed description is therefore omitted.

In some embodiments, the functional features of p-type transistor M6 and n-type transistor M7 are incorporated into transmission gate 704 (e.g., corresponding p-type transistor M31 and corresponding n-type transistor M32).

Clock gating circuit 700A includes NAND logic gate 702, transmission gate 704, p-type transistors M9, M10 and M13, n-type transistors M11, M12 and M14, inverter 204 and inverter 206.

NAND logic gate 702 includes p-type transistors M27 and M28, and n-type transistors M29 and M30.

In comparison with NOR logic gate 202 of FIG. 2A, p-type transistors M27 and M28 of FIG. 7A and n-type transistors M29 and M30 of FIG. 7A replace corresponding p-type transistors M1 and M2 and corresponding n-type transistors M3 and M4, and similar detailed description is therefore omitted.

A source terminal of p-type transistor M27 is coupled to the voltage supply VDD. Each of a gate terminal of p-type transistor M27 and a gate terminal of n-type transistor M30 are coupled together, and are configured to receive the test enable signal TE.

In FIG. 7A, each of a drain terminal of p-type transistor M27, a drain terminal of p-type transistor M28, a drain terminal of n-type transistor M29, node ND1, one of a drain or a source terminal of p-type transistor M31, and one of a drain or a source terminal of n-type transistor M32 are coupled together.

A source terminal of p-type transistor M28 is coupled to the voltage supply VDD. Each of a gate terminal of p-type transistor M28 and a gate terminal of n-type transistor M29 are coupled together, and are configured to receive the enable signal EN.

At least p-type transistor M27 or p-type transistor M28 is configured to selectively couple the voltage supply VDD to node ND1 in response to at least the test enable signal TE or the enable signal EN. In some embodiments, at least p-type transistor M27 or p-type transistor M28 is configured to generate the control signal NET2 in response to at least the test enable signal TE or the enable signal EN.

A source terminal of n-type transistor M29 is coupled to a drain terminal of n-type transistor M30. A source terminal of n-type transistor M30 is coupled to the reference voltage supply VSS.

N-type transistors M29 and M30 are configured to selectively couple the reference voltage supply VSS to node ND1 in response to at least the test enable signal TE or the enable signal EN. In some embodiments, n-type transistors M29 and M30 are configured to generate the control signal NET2 in response to the test enable signal TE and the enable signal EN.

P-type transistors M27 and M28 and n-type transistors M29 and M30 are arranged as an exemplary NAND logic gate 702. In some embodiments, the control signal NET2 is a NAND output signal, and is generated based on performing a NAND operation on the enable signal EN and the test enable signal TE. Other logic types are within the scope of the present disclosure. For example, in some embodiments, a different logic type is substituted for NAND logic gate 702, such as an OR logic gate, an AND logic gate, a NOR logic gate or other suitable logic gates, and transistors M27, M28, M29 and M30 are arranged consistent with these other logic types.

Transmission gate 704 is coupled between at least node ND1 and node ND2. Transmission gate 704 has a first input terminal configured to receive input clock signal CP, a second input terminal configured to receive control signal NET1 and a third input terminal configured to receive control signal NET2. Transmission gate 704 has an output terminal configured to output control signal NET0.

Transmission gate 704 is configured to couple or decouple node ND1 and node ND2. Transmission gate 704 is enabled (e.g., turned on) or disabled (e.g., turned off) in response to the input clock signal CP and the control signal NET1. If enabled, transmission gate 704 is configured to output or pass the control signal NET2 to at least node ND2, and therefore the control signal NET0 is the control signal NET2. If disabled, transmission gate 704 does not pass or output the control signal NET2 to at least node ND2, and therefore the control signal NET0 is electrically isolated from the control signal NET2.

Transmission gate 704 comprises a p-type transistor M31 and an n-type transistor M32. A gate terminal of p-type transistor M31 is configured to receive the input clock signal CP. In some embodiments, each of the gate terminal of p-type transistor M31, the gate terminal of p-type transistor M13 and the gate terminal of n-type transistor M12 are coupled together.

A gate terminal of n-type transistor M32 is configured to receive the control signal NET1 from node ND3. Each of the gate terminal of n-type transistor M32, the gate terminal of p-type transistor M9, the drain terminal of p-type transistor M10, the drain terminal of p-type transistor M13, the drain terminal of n-type transistor M14, the input terminal of inverter 206 (e.g., the gate terminal of p-type transistor M15 and the gate terminal of n-type transistor M16), and node ND3 are coupled together.

P-type transistor M31 is turned on or off based on the input clock signal CP. N-type transistor M32 is turned on or off based on the control signal NET1. One of a drain or a source terminal of p-type transistor M31 is coupled to at least one of a drain or a source terminal of n-type transistor M32, and is configured as the third input terminal of transmission gate 704. The other of the source or the drain terminal of p-type transistor M31 is coupled to at least the other of the source or the drain terminal of n-type transistor M32, and is configured as the output terminal of transmission gate 704.

In FIG. 7A, each of node ND2, the other of the source or the drain terminal of p-type transistor M31, the other of the source or the drain terminal of n-type transistor M32, the drain terminal of p-type transistor M9, the gate terminal of p-type transistor M10, the drain terminal of n-type transistor M11, the gate terminal of n-type transistor M14, the input terminal of inverter 204 (e.g., the gate terminal of p-type transistor M17 and the gate terminal of n-type transistor M18) are coupled together.

By utilizing clock gating circuit 700A, a number of transistors, e.g., p-type transistors M13 and M31 and n-type transistor M12, toggled by the input clock signal CP is three. In some embodiments, by utilizing clock gating circuit 700A, the total number of transistors toggled by the input clock signal CP is reduced when compared with other clock gating cells, resulting in clock gating circuit 700A consuming less dynamic clock power than other clock gating cells.

In some embodiments, by utilizing clock gating circuit 700A, the total number of transistors is reduced when compared with other clock gating cells resulting in clock gating circuit 700A occupying less area than other clock gating cells. For example, in some embodiments, by utilizing clock gating circuit 700A, a total number of transistors is less than twenty. In some embodiments, by utilizing clock gating circuit 700A, the total number of transistors is sixteen.

Figure 7B:
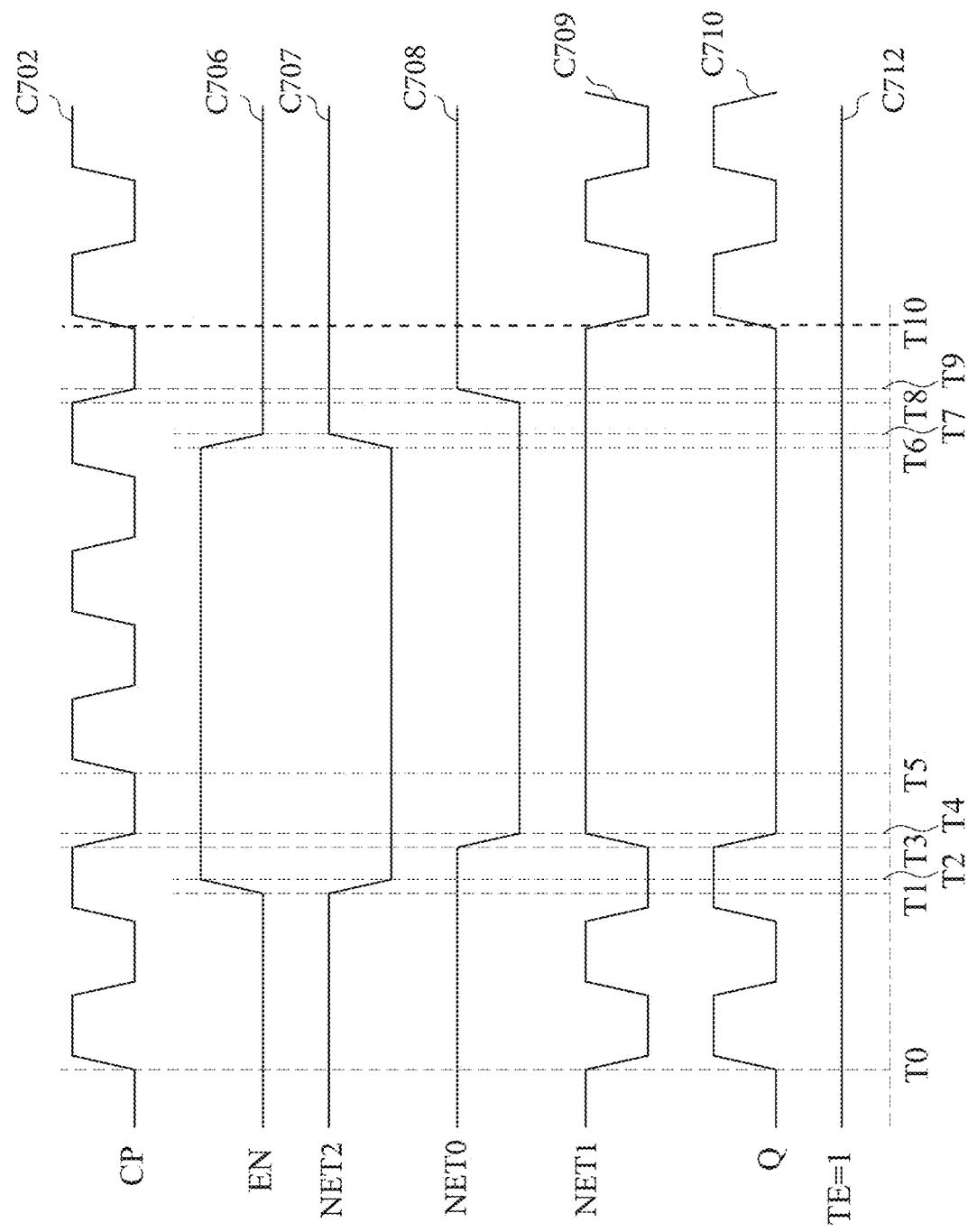
FIG. 7B is a graph of a waveform of the clock gating circuit of FIG. 7A, in accordance with some embodiments.

FIG. 7B is a graph of a waveform 700B of clock gating circuit 700A of FIG. 7A, in accordance with some embodiments.

Waveform 700B includes waveforms of signals when clock gating circuit 700A is initially enabled (e.g., EN=0), then disabled (e.g., EN=1) and then is enabled (e.g., EN=0) again. In this illustration, initially, test enable signal TE is a high logical value, enable signal EN is a low logical value, and the output clock signal Q is a low logical value.

In some embodiments, curve C702 represents input clock signal CP of FIG. 7A; curve C706 represents enable signal EN; curve C707 represents control signal NET2; curve C708 represents control signal NET0; curve C709 represents control signal NET1; curve C710 represents output clock signal Q; and curve C712 represents test enable signal TE.

Prior to time T0, curve C702 is a low logical value causing p-type transistors M13 and M31 to be turned on. Prior to time T0, curve C706 is a low logical value causing p-type transistor M28 to be turned on, and n-type transistor M29 to be turned off. In response to p-type transistor M28 being turned on causes curve C707 to be a high logical value. In response to p-type transistor M13 being turned on causes curve C709 to be a high logical value, thereby setting the output clock signal Q (curve C710) to be a low logical value.

In response to curve C709 being a high logical value, causes n-type transistor M32 to be turned on. In response to n-type transistor M32 and p-type transistor M31 being turned on, causes curve C708 to be a high logical value, thereby causing n-type transistor M14 to be turned on, thereby electrically coupling node ND3 to node ND4.

Between time T0 and T4 (or beyond time T10), at least curve C702 or C710 oscillate inversely from curve C709. Between time T0 and T4 (or beyond time T10), curve C702 and C710 are similar to each other since the clock gating circuit 700A is enabled by enable signal EN being a low logic value. In other words, the clock gating circuit 700A will pass input clock signal CP as the output clock signal Q.

At time T0, curve C702 has a rising edge and begins to transition to a high logical value causing n-type transistor M12 to begin to turn on, thereby causing p-type transistor M13 to turn-off, and thereby causing node ND3 and curve C709 to begin to transition from a high logical value to a low logical value. In response to curve C709 transitioning from a high logical value to a low logical value, causes curve C710 to begin to transition from a low logical value to a high logical value. In response to curve C709 transitioning from a high logical value to a low logical value, causes p-type transistor M9 to begin to turn on, thereby keeping curve C708 at a high logical value.

At time T1, curve C706 transitions from a low logical value to a high logical value causing p-type transistor M28 to begin to turn off, and n-type transistor M29 to begin to turn on. In response to n-type transistor M29 beginning to turn on, causes node ND1 and curve C707 to transition from a high logical value to a low logical value. However, since curve C702 is a high logical value at time T1 causes p-type transistor M31 to be turned off, and since curve C709 is a low logical value causes n-type transistor M32 to be turned off, and curve C708 does not transition yet to a low logical value.

At time T2, curve C706 is a high logical value causing p-type transistor M28 to be turned off, and n-type transistor M29 to be turned on, thereby causing curve C707 to be a low logical value.

At time T3, curve C702 transitions from a high logical value to a low logical value, causing p-type transistors M13 and M31 to begin to turn on. In response to p-type transistor M13 beginning to turn on, thereby causes curve C709 to transition from a low logical value to a high logical value. In response to curve C709 transitioning from a low logical value to a high logical value, causes curve C710 to begin to transition from a high logical value to a low logical value. In response to curve C709 transitioning from a low logical value to a high logical value, causes p-type transistor M9 to begin to turn off, and causes n-type transistor M32 to begin to turn on.

In response to n-type transistor M32 and p-type transistor M31 beginning to turn on, causes curve C708 to begin to transition from a high logical value to a low logical value. In response to curve C708 beginning to transition from a high logical value to a low logical value causes p-type transistor M17 to turn on, thereby pulling the gate of n-type transistor M11 to a high logical value, thereby turning on n-type transistor M11, and electrically coupling node ND2 to node ND4.

At time T4, curve C702 is a low logical value, curve C709 is a high logical value, curve C710 is a low logical value, and curve C708 is a low logical value.

At time T5, curve C702 begins to transition from a low logical value to a high logical value, but since the clock gating circuit 700A is disabled by enable signal EN being a high logic value, causes the output clock signal Q to remain at a low logical value.

Between time T5 and T6, curve C710 remains at a low logic value.

At time T6, curve C706 transitions from a high logical value to a low logical value causing p-type transistor M28 to begin to turn on, and n-type transistor M29 to begin to turn off. In response to p-type transistor M28 beginning to turn on, causes node ND1 and curve C707 to transition from a low logical value to a high logical value. However, since curve C702 is a high logical value at time T6 causes p-type transistor M31 to be turned off, and curve C708 does not transition yet to a high logical value.

At time T7, curve C706 is a low logical value causing p-type transistor M28 to be turned on, and n-type transistor M29 to be turned off, thereby causing curve C707 to be a high logical value.

At time T8, curve C702 transitions from a high logical value to a low logical value, causing p-type transistor M31 to begin to turn on. In response to p-type transistor M31 being turned on causes curve C708 to transition from a low logical value to a high logical value.

At time T9, curve C702 is a low logical value, p-type transistor M31 is turned on, and curve C708 is a high logical value.

At time T10, curve C702 transitions from a low logical value to a high logical value, is similar to the discussion above for time T0, and similar detailed description is omitted.

Beyond time T10, curve C702 and C710 are similar to each other since the clock gating circuit 700A is enabled by enable signal EN being a low logic value. In other words, the clock gating circuit 700A will pass input clock signal CP as the output clock signal Q.

Method

Figure 8A:
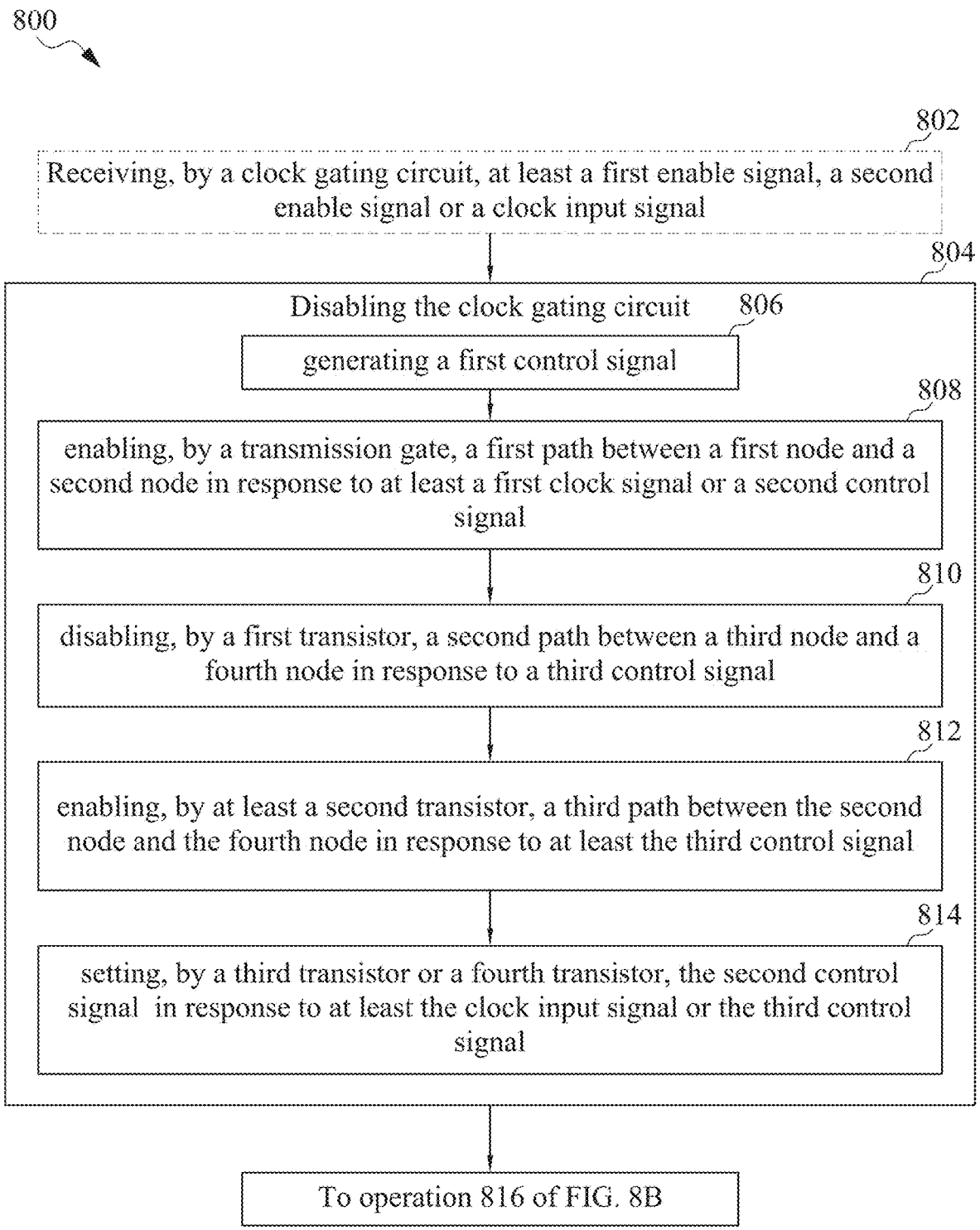
FIGS. 8A-8B are a flowchart of a method of operating a circuit, in accordance with some embodiments.
Figure 8B:
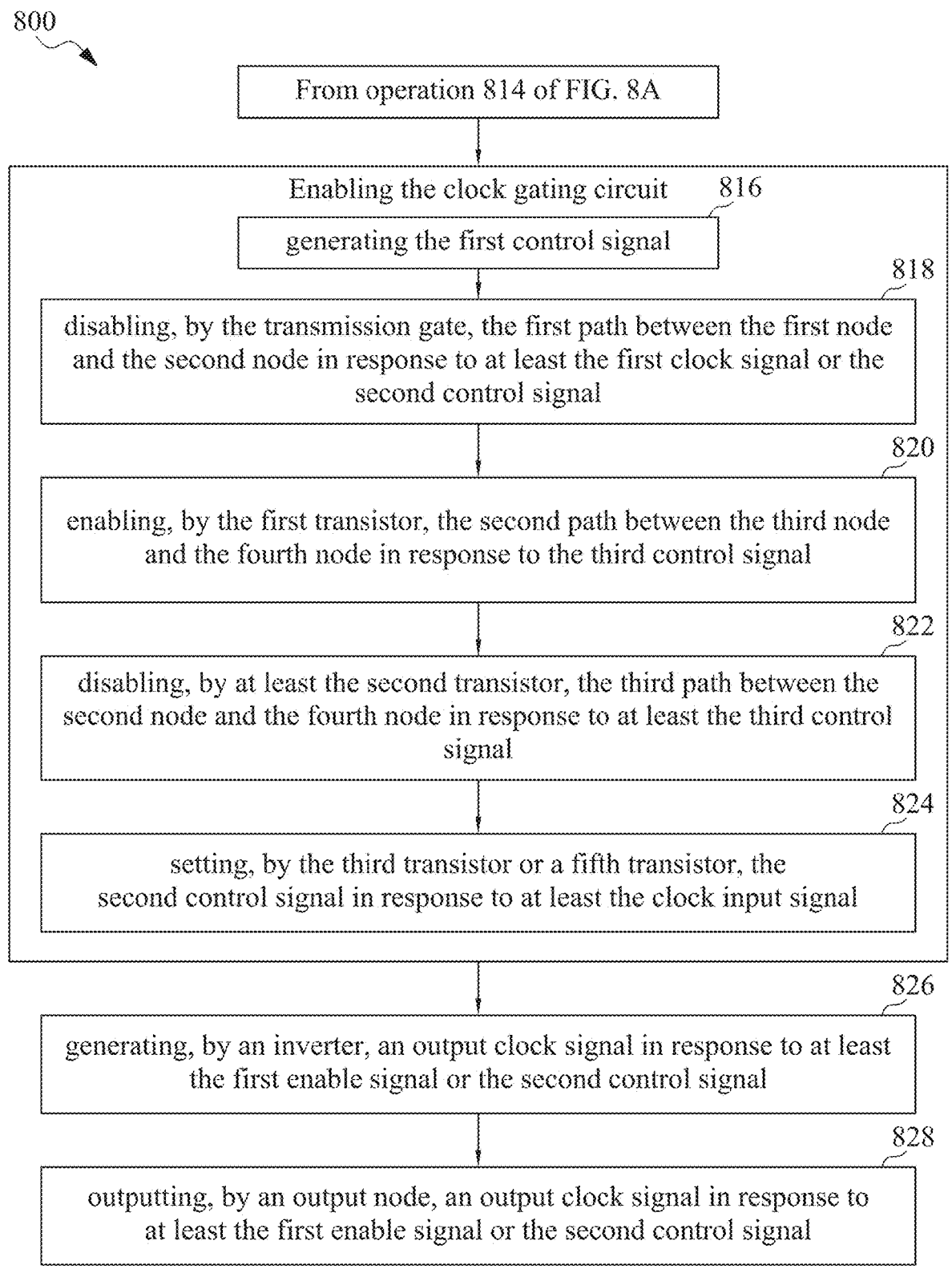

FIGS. 8A-8B are flowcharts of a method 800 of operating a circuit, such as the circuit of FIGS. 1A, 2A, 3A, 4, 5A, 6A and 7A, in accordance with some embodiments. It is understood that additional operations may be performed before, during, and/or after the method 800 depicted in FIGS. 8A-8B, and that some other operations or processes may only be briefly described herein. It is understood that method 800 utilizes features of one or more of circuit 100A of FIG. 1A, waveform 100B of FIG. 1B, clock gating circuits 200A, 300A, 500A, 600A & 700A of corresponding FIGS. 2A, 3A, 5A, 6A & 7A, inverter 400 of FIG. 4, or waveforms 200B, 300B, 500B, 600B & 700B of corresponding FIGS. 2B, 3B, 5B, 6B & 7B.

In some embodiments, method 800 is described with respect to circuit 700A of FIG. 7A and waveform 700B of FIG. 7B, but method 800 is similarly applicable to each of the circuits described in the present disclosure (integrated circuit 100A, clock gating circuits 200A, 300A, 500A, 600A & 700A and inverter 400).

In operation 802 of method 800, at least a first enable signal, a second enable signal or a clock input signal CP or CPB is received by a clock gating circuit.

In some embodiments, for method 800, the first enable signal includes enable signal E or EN, and the second enable signal includes enable signal TE. In some embodiments, the clock gating circuit of method 800 includes at least integrated gating circuit 100A, clock gating circuit 200A, 300A, 500A and 600A or 700A or inverter 400.

In operation 804 of method 800, the clock gating circuit is disabled in response to at least the first enable signal or the second enable signal. In some embodiments, operation 804 of method 800 includes the clock gating circuit being disabled in response to at least the first enable signal (e.g., enable signal E=0 or EN=1) having a first logical value (e.g., E=0 or EN=1). In some embodiments, for method 800, the first logical value includes a logical high. In some embodiments, for method 800, the first logical value includes a logical low.

In some embodiments, operation 804 of method 800 includes, the clock gating circuit being disabled in response to the second enable signal (TE) having the first logical value or a second logical value. In some embodiments, for method 800, the second logical value is inverted from the first logical value. In some embodiments, for method 800, the second logical value includes a logical low. In some embodiments, for method 800, the second logical value includes a logical high.

In some embodiments, operation 804 includes one or more of operations 806, 808, 810, 812, or 814.

In operation 806 of method 800, a first control signal is generated. In some embodiments, for method 800, the first control signal includes control signal NET2. In some embodiments, for method 800, the first control signal includes control signal NET0, NET1 or NET0B.

In operation 808 of method 800, a first path between a first node (e.g, node ND1) and a second node (e.g., node ND2 or ND2') is enabled by a transmission gate 502 or 704 in response to at least a clock input signal (e.g., CP or CPB) or a second control signal.

In some embodiments, for method 800, the second control signal includes control signal NET1. In some embodiments, for method 800, the second control signal includes control signal NET0, NET2 or NET0B. In some embodiments, for method 800, the second control signal includes output clock signal Q as shown in FIG. 5A.

In operation 810 of method 800, a second path between a third node (e.g., node ND3) and a fourth node (e.g., node ND4) is disabled by a first transistor in response to a third control signal.

In some embodiments, for method 800, the first transistor includes n-type transistor M14. In some embodiments, for method 800, the first transistor includes one or more transistors in FIGS. 2A-3A, 4 and 5A-7A other than n-type transistor M14.

In some embodiments, for method 800, the third control signal includes control signal NET0. In some embodiments, for method 800, the third control signal includes control signal NET0B, NET1 or NET2.

In operation 812 of method 800, a third path between the second node and the fourth node is enabled by at least a second transistor in response to at least the third control signal.

In some embodiments, for method 800, the second transistor includes n-type transistor M11. In some embodiments, for method 800, the second transistor includes one or more transistors in FIGS. 2A-3A, 4 and 5A-7A other than n-type transistor M11.

In operation 814 of method 800, the second control signal (e.g., NET1) is set in response to at least the clock input signal or the third control signal (NET0) by a third transistor or a fourth transistor.

In some embodiments, for method 800, the third transistor includes p-type transistor M13. In some embodiments, for method 800, the third transistor includes one or more transistors in FIGS. 2A-3A, 4 and 5A-7A other than p-type transistor M13.

In some embodiments, for method 800, the fourth transistor includes p-type transistor M10. In some embodiments, for method 800, the fourth transistor includes one or more transistors in FIGS. 2A-3A, 4 and 5A-7A other than p-type transistor M10.

In some embodiments, operation 814 includes one or more of operations 814a, 814b or 814c.

In some embodiments, in operation 814, where the second control signal is set by the third transistor (M13) in response to at least the clock input signal includes operation 814a.

In operation 814a of method 800, a first value (e.g., logical 1) of the second control signal (NET1) is set by the third transistor (M13) in response to the clock input signal (CP=0 or CPB=0) having a second value (e.g., logical 0) different from the first value.

In some embodiments, in operation 814, where the second control signal is set by the fourth transistor (M10) in response to at least the clock input signal or the third control signal (NET0) includes at least operation 814b or 814c.

In operation 814b of method 800, the second value (e.g., logical 0) of the third control signal (e.g., NET0) is set by a fifth transistor (M12) in response to the clock input signal (CP=1 or CPB=1) having the first value (e.g., logical 1).

In some embodiments, for method 800, the fifth transistor includes n-type transistor M12. In some embodiments, for method 800, the fifth transistor includes one or more transistors in FIGS. 2A-3A, 4 and 5A-7A other than n-type transistor M12.

In operation 814c of method 800, the first value (e.g., logical 1) of the second control signal (e.g., NET1) is set by the fourth transistor (e.g., M10) in response to the third control signal (e.g., NET0) having the second value (e.g., logical 0).

In operation 816 of method 800, the clock gating circuit is enabled in response to at least the first enable signal or the second enable signal. In some embodiments, operation 816 of method 800 includes the clock gating circuit being enabled in response to at least the first enable signal (e.g., enable signal E=1 or EN=0) having a second logical value (e.g., E=1 or EN=0). In some embodiments, for method 800, the second logical value includes logical low or logical high.

In some embodiments, operation 816 of method 800 includes, the clock gating circuit being enabled in response to the second enable signal (TE) having the first logical value or the second logical value.

In some embodiments, operation 816 includes one or more of operations 818, 820, 822, 824, or 826.

In operation 818 of method 800, the first control signal is generated.

In operation 820 of method 800, the first path between the first node and the second node is disabled by the transmission gate in response to at least the clock input signal CP or CPB or the second control signal.

In operation 822 of method 800, the second path between the third node and the fourth node is enabled by the first transistor (e.g., n-type transistor M14) in response to the third control signal.

In operation 824 of method 800, the third path between the second node and the fourth node is disabled by at least the second transistor in response to at least the third control signal.

In operation 826 of method 800, the second control signal is set by the third transistor (M13) or the fifth transistor (M12) in response to at least the clock input signal.

In some embodiments, operation 826 includes one or more of operations 826a, 826b or 826c.

In some embodiments, in operation 826, where the second control signal is set by the third transistor (M13) in response to at least the clock input signal includes operation 826a.

In operation 826a of method 800, a first value (e.g., logical 1) of the second control signal (NET1) is set by the third transistor (M13) in response to the clock input signal (CP=0 or CPB=0) having a second value (e.g., logical 0) different from the first value.

In some embodiments, in operation 826, where the second control signal is set by the fifth transistor (M12) in response to at least the clock input signal includes at least operation 826b or 826c.

In operation 826b of method 800, the second value (e.g., logical 0) of the second control signal (NET1) is set by the fifth transistor (M12) in response to the clock input signal (CP=1 or CPB=1) having the first value (e.g., logical 1).

In operation 826c of method 800, the first value (e.g., logical 1) of the third control signal (e.g., NET0) is set by a sixth transistor (e.g., M9) in response to the second control signal (e.g., NET1) having the second value (e.g., logical 0).

In some embodiments, for method 800, the sixth transistor includes p-type transistor M9. In some embodiments, for method 800, the sixth transistor includes one or more transistors in FIGS. 2A-3A, 4 and 5A-7A other than p-type transistor M9.

In operation 828 of method 800, an output clock signal Q is generated in response to at least the first enable signal (e.g., E or EN) or the second control signal. In some embodiments, operation 828 comprises generating, by an inverter 206, the output clock signal in response to at least the first enable signal (e.g., E or EN) or the second control signal.

In operation 830 of method 800, the output clock signal (Q) is output by an output node (e.g., node NDout) in response to at least the first enable signal (EN) or the second control signal (NET1).

In some embodiments, the output node (e.g., node NDout) corresponds to the output terminal of inverter 206 as shown in FIGS. 2A, 6A and 7A. In some embodiments, the output node (e.g., node NDout) corresponds to the fourth node (e.g., ND4) as shown in FIGS. 3A and 5A.

In some embodiments, the clock input signal CP or CPB does not correspond to the output clock signal Q. In some embodiments, the clock input signal CP or CPB does not correspond to the output clock signal Q, when the clock gating circuit is disabled (e.g., operation 804).

In some embodiments, the clock input signal CP or CPB corresponds to the output clock signal Q. In some embodiments, the clock input signal CP or CPB corresponds to the output clock signal Q, when the clock gating circuit is enabled (e.g., operation 816).

While method 800 is described above with reference to FIGS. 7A-7B, it is understood that method 800 utilizes the features of one or more of FIGS. 1A-1B, 2A-2B, 3A-3B, 4, 5A-5B and 6A-6B. In these embodiments, other operations of method 800 would be performed consistent with the description and operation of integrated circuit 100A, clock gating circuits 200A, 300A, 500A and 600A inverter 400, and waveforms 100A, 200B, 300B, 500B & 600B.

In some embodiments, one or more of the operations of method 800 is not performed.

Furthermore, various PMOS or NMOS transistors shown in FIGS. 2A-7A are of a particular dopant type (e.g., N-type or P-type) and are for illustration purposes. Embodiments of the disclosure are not limited to a particular transistor type, and one or more of the p-type or n-type transistors shown in FIGS. 2A-7A can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in the above description is within the scope of various embodiments. Selecting different numbers of transmission gates in clock gating circuit 500A or 700A is within the scope of various embodiments. Selecting different numbers of transistors in clock gating circuit 200A, 300A, 500A, 600A or 700A or inverter 400 is within the scope of various embodiments.

One aspect of this description relates to a clock gating circuit. The clock gating circuit includes a NOR logic gate, a transmission gate, a cross-coupled pair of transistors, and a first transistor. The NOR logic gate is coupled to a first node, and is configured to receive a first enable signal and a second enable signal, and to output a first control signal. The transmission gate is coupled between the first node and a second node, and is configured to receive the first control signal, an inverted clock input signal and a clock output signal. The cross-coupled pair of transistors is coupled between the second node and an output node, and is configured to receive at least a second control signal. In some embodiments, the first transistor is of a first type. The first transistor includes a first gate terminal, a first drain terminal and a first source terminal. The first gate terminal is configured to receive the inverted clock input signal. The first drain terminal is coupled to at least the output node. The first source terminal is coupled to a reference voltage supply. The first transistor is configured to adjust the clock output signal responsive to the inverted clock input signal.

Another aspect of this description relates to a clock gating circuit. The clock gating circuit includes a NAND logic gate, a transmission gate, a first inverter, and a first transistor of a first type. The NAND logic gate is coupled to a first node, and is configured to receive a first enable signal and a second enable signal, and to output a first control signal. The transmission gate is coupled to the NAND logic gate, a second node and a third node. The transmission gate is configured to receive at least a clock input signal or a second control signal. The first inverter is coupled between the third node and an output node, and is configured to generate a clock output signal responsive to the second control signal. The first transistor includes a first gate terminal, a first drain terminal and a first source terminal. The first gate terminal is configured to receive the clock input signal. The first source terminal is coupled to a voltage supply. The first drain terminal is coupled to at least the third node or the first inverter. The first transistor is configured to adjust at least the second control signal or the clock output signal responsive to the clock input signal.

Yet another aspect of this description relates to a method of operating a circuit. The method includes disabling a clock gating circuit in response to at least a first enable signal or a second enable signal, and outputting, by an output node, an output clock signal in response to at least the first enable signal or the second control signal. In some embodiments, disabling the clock gating circuit includes generating a first control signal, and enabling, by a transmission gate, a first path between a first node and a second node in response to at least a clock input signal or a second control signal. In some embodiments, disabling the clock gating circuit further includes disabling, by a first transistor, a second path between a third node and a fourth node in response to a third control signal. In some embodiments, disabling the clock gating circuit further includes enabling, by at least a second transistor, a third path between the second node and the fourth node in response to at least the third control signal. In some embodiments, disabling the clock gating circuit further includes setting, by a third transistor or a fourth transistor, the second control signal in response to at least the clock input signal. In some embodiments, the clock input signal does not correspond to the output clock signal.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock gating circuit comprising:
   a NAND logic gate coupled to a first node, and configured to receive a first enable signal and a second enable signal, and to output a first control signal;
   a transmission gate coupled to the NAND logic gate, a second node and a third node, the transmission gate being configured to receive at least a clock input signal or a second control signal;
   a first inverter coupled between the third node and an output node, and configured to generate a clock output signal responsive to the second control signal; and a first transistor of a first type, the first transistor including a first gate terminal, a first drain terminal and a first source terminal, the first gate terminal being configured to receive the clock input signal, the first source terminal being coupled to a voltage supply, the first drain terminal being coupled to at least the third node or the first inverter, and the first transistor being configured to adjust at least the second control signal or the clock output signal responsive to the clock input signal.

2. The clock gating circuit of claim 1, further comprising:
a cross-coupled pair of transistors coupled between the second node and the third node, and being configured to receive the second control signal and a third control signal.

3. The clock gating circuit of claim 2, wherein the cross-coupled pair of transistors comprises:
a second transistor of the first type, the second transistor being configured to adjust the third control signal responsive to the second control signal, the second transistor including a second gate terminal, a second drain terminal and a second source terminal, the second gate terminal being configured to receive the second control signal, and the second source terminal being coupled to the voltage supply; and
a third transistor of the first type, the third transistor being configured to adjust the second control signal responsive to the third control signal, the third transistor including a third gate terminal, a third drain terminal and a third source terminal, the third gate terminal being configured to receive the third control signal, the third source terminal being coupled to the voltage supply,
wherein each of the second gate terminal, the third drain terminal, the first drain terminal, the third node and an input terminal of the first inverter are coupled together, and
each of the third gate terminal, the second drain terminal, the transmission gate and the second node are coupled together.

4. The clock gating circuit of claim 3, wherein the first inverter comprises:
a fourth transistor of the first type, the fourth transistor including a fourth gate terminal, a fourth drain terminal and a fourth source terminal, the fourth gate terminal being configured to receive the second control signal, the fourth source terminal being coupled to the voltage supply; and
a fifth transistor of a second type different from the first type, the fifth transistor including a fifth gate terminal, a fifth drain terminal and a fifth source terminal, the fifth gate terminal being configured to receive the second control signal, the fifth source terminal being coupled to a reference voltage supply,
wherein each of the fifth drain terminal, the fourth drain terminal and the output node are coupled together, and
each of the fifth gate terminal, the fourth gate terminal, the third node, the second gate terminal, the third drain terminal, and the first drain terminal are coupled together.

5. The clock gating circuit of claim 1, further comprising:
a second transistor of a second type different from the first type, the second transistor including a second gate terminal, a second drain terminal and a second source terminal, the second gate terminal being coupled to at least the second node or the transmission gate, and configured to receive a third control signal, the second drain terminal being coupled to the third node, the first drain terminal and an input terminal of the first inverter, and the second source terminal being coupled to at least a fourth node; and
a third transistor of the second type, the third transistor including a third gate terminal, a third drain terminal and a third source terminal, the third gate terminal being configured to receive the clock input signal, the third drain terminal being coupled to the second source terminal and the fourth node, and the third source terminal being coupled to a reference voltage supply,
the third transistor being configured to adjust the second control signal thereby adjusting the clock output signal responsive to the clock input signal.

6. The clock gating circuit of claim 5, further comprising:
a fourth transistor of the second type coupled between the second node and the fourth node, the fourth transistor including a fourth gate terminal, a fourth drain terminal and a fourth source terminal, the fourth gate terminal being configured to receive an inverted third control signal, the fourth drain terminal being coupled to the second node, the second gate terminal and the transmission gate, and the fourth source terminal being coupled to the fourth node, the third drain terminal and the second source terminal.

7. The clock gating circuit of claim 6, further comprising:
a second inverter coupled between the second node and the fourth transistor, and configured to generate the inverted third control signal responsive to the third control signal.

8. The clock gating circuit of claim 7, wherein the second inverter comprises:
a fifth transistor of the second type, the fifth transistor including a fifth gate terminal, a fifth drain terminal and a fifth source terminal, the fifth gate terminal being configured to receive the third control signal, the fifth drain terminal being coupled to at least the fourth gate terminal, and the fifth source terminal being coupled to the voltage supply; and
a sixth transistor of the first type, the sixth transistor including a sixth gate terminal, a sixth drain terminal and a sixth source terminal, the sixth gate terminal being configured to receive the third control signal, the sixth drain terminal being coupled to the fifth drain terminal and the fourth gate terminal, the sixth source terminal being coupled to the reference voltage supply, and each of the sixth gate terminal, the fifth gate terminal, the second node and the second gate terminal being coupled together.

9. The clock gating circuit of claim 1, wherein the transmission gate comprises:
a second transistor of a second type different from the first type, the second transistor including a second gate terminal, a second drain terminal and a second source terminal, the second gate terminal being configured to receive the clock input signal, the second source terminal being coupled to the first node and the NAND logic gate, and the second drain terminal being coupled to at least the second node; and
a third transistor of the first type, the third transistor including a third gate terminal, a third drain terminal and a third source terminal, the third gate terminal being configured to receive the second control signal, and being coupled to the third node, the first drain terminal and an input terminal of the first inverter, the third source terminal being coupled to the second source terminal, the first node and the NAND logic gate, and the third drain terminal being coupled to the second node and the second drain terminal.

10. A method of operating a circuit, the method comprising:
disabling a clock gating circuit in response to at least a first enable signal or a second enable signal, wherein disabling the clock gating circuit comprises:
generating a first control signal;
enabling, by a transmission gate, a first path between a first node and a second node in response to at least a clock input signal or a second control signal;
disabling, by a first transistor, a second path between a third node and a fourth node in response to a third control signal;
enabling, by at least a second transistor, a third path between the second node and the fourth node in response to at least the third control signal; and
setting, by a third transistor or a fourth transistor, the second control signal in response to at least the clock input signal; and
outputting, by an output node, an output clock signal in response to at least the first enable signal or the second control signal,
wherein the clock input signal does not correspond to the output clock signal.

11. The method of claim 10, wherein setting, by the third transistor or the fourth transistor, the second control signal in response to at least the clock input signal comprises:
setting, by the third transistor, a first value of the second control signal in response to the clock input signal having a second value different from the first value; or
setting, by a fifth transistor, the second value of the third control signal in response to the clock input signal having the first value; and
setting, by the fourth transistor, the first value of the second control signal in response to the third control signal having the second value.

12. The method of claim 10, further comprising:
enabling the clock gating circuit in response to at least the first enable signal or the second enable signal, wherein enabling the clock gating circuit comprises:
generating the first control signal;
disabling, by the transmission gate, the first path between the first node and the second node in response to at least the clock input signal or the second control signal;
enabling, by the first transistor, the second path between the third node and the fourth node in response to the third control signal;
disabling, by at least the second transistor, the third path between the second node and the fourth node in response to at least the third control signal; and
setting, by the third transistor or a fifth transistor, the second control signal in response to at least the clock input signal,
wherein the clock input signal corresponds to the output clock signal.

13. The method of claim 12, wherein setting, by the third transistor or the fifth transistor, the second control signal in response to at least the clock input signal comprises:
setting, by the third transistor, a first value of the second control signal in response to the clock input signal having a second value different from the first value; or
setting, by the fifth transistor, the second value of the third control signal in response to the clock input signal having the first value; and setting, by a sixth transistor, the first value of the third control signal in response to the second control signal having the second value.

14. A clock gating circuit comprising:
a NAND logic gate coupled to a first node, and configured to receive a first enable signal and a second enable signal, and to set a first control signal of the first node;
a transmission gate coupled between the first node and a second node the transmission gate including a first input terminal configured to receive at least a clock input signal and a second input terminal configured to receive a second control signal of a third node;
a first inverter coupled between the third node and an output node, and configured to generate a clock output signal responsive to the second control signal; and
a first transistor of a first type, the first transistor including a first gate terminal, a first drain terminal and a first source terminal, the first gate terminal being configured to receive the clock input signal, and being coupled to the first input terminal of the transmission gate, the first source terminal being coupled to a voltage supply, the first drain terminal being coupled to at least the third node or the first inverter, and the first transistor being configured to adjust at least the second control signal or the clock output signal responsive to the clock input signal.

15. The clock gating circuit of claim 14, further comprising:
a second transistor of a second type different from the first type, the second transistor including a second gate terminal, a second drain terminal and a second source terminal, the second gate terminal being coupled to at least the second node or the transmission gate, and configured to receive a third control signal of the second node, the second drain terminal being coupled to the third node, the first drain terminal and an input terminal of the first inverter, and the second source terminal being coupled to at least a fourth node; and
a third transistor of the second type, the third transistor including a third gate terminal, a third drain terminal and a third source terminal, the third gate terminal being configured to receive the clock input signal, and being coupled to the first input terminal of the transmission gate and the first gate terminal, the third drain terminal being coupled to the second source terminal and the fourth node, and the third source terminal being coupled to a reference voltage supply different from the voltage supply,
the third transistor being configured to adjust the second control signal thereby adjusting the clock output signal responsive to the clock input signal.

16. The clock gating circuit of claim 15, further comprising:
a fourth transistor of the second type coupled between the second node and the fourth node, the fourth transistor including a fourth gate terminal, a fourth drain terminal and a fourth source terminal, the fourth gate terminal being configured to receive an inverted third control signal, the fourth drain terminal being coupled to the second node, the second gate terminal and the transmission gate, and the fourth source terminal being coupled to the fourth node, the third drain terminal and the second source terminal, wherein the inverted third control signal is inverted from the third control signal.

17. The clock gating circuit of claim 16, further comprising:

a second inverter coupled between the second node and the fourth transistor, and configured to generate the inverted third control signal responsive to the third control signal.

18. The clock gating circuit of claim 17, further comprising:
a cross-coupled pair of transistors coupled between the second node and the third node, and being configured to receive the second control signal and the third control signal.

19. The clock gating circuit of claim 18, wherein the cross-coupled pair of transistors comprises:
a fifth transistor of the first type, the fifth transistor being configured to adjust the third control signal responsive to the second control signal, the fifth transistor including a fifth gate terminal, a fifth drain terminal and a fifth source terminal, the fifth gate terminal being configured to receive the second control signal, and the fifth source terminal being coupled to the voltage supply; and
a sixth transistor of the first type, the sixth transistor being configured to adjust the second control signal responsive to the third control signal, the sixth transistor including a sixth gate terminal, a sixth drain terminal and a sixth source terminal, the sixth gate terminal being configured to receive the third control signal, the sixth source terminal being coupled to the voltage supply,
wherein each of the fifth gate terminal, the sixth drain terminal, the first drain terminal, the third node and the input terminal of the first inverter are coupled together, and
each of the sixth gate terminal, the fifth drain terminal, the transmission gate and the second node are coupled together.

20. The clock gating circuit of claim 19, wherein the first inverter comprises:
a seventh transistor of the first type, the seventh transistor including a seventh gate terminal, a seventh drain terminal and a seventh source terminal, the seventh gate terminal being configured to receive the second control signal, the seventh source terminal being coupled to the voltage supply; and
an eighth transistor of the second type, the eighth transistor including an eighth gate terminal, an eighth drain terminal and an eighth source terminal, the eighth gate terminal being configured to receive the second control signal, the eighth source terminal being coupled to the reference voltage supply,
wherein each of the eighth drain terminal, the seventh drain terminal and the output node are coupled together, and
each of the eighth gate terminal, the seventh gate terminal, the third node, the fifth gate terminal, the sixth drain terminal, and the first drain terminal are coupled together.

* * * * *